United States Patent
Tsukihara et al.

(10) Patent No.: US 10,030,299 B2
(45) Date of Patent: Jul. 24, 2018

(54) SURFACE-COATED BORON NITRIDE SINTERED BODY TOOL

(71) Applicant: SUMITOMO ELECTRIC HARDMETAL CORP., Itami-shi (JP)

(72) Inventors: Nozomi Tsukihara, Itami (JP); Makoto Setoyama, Itami (JP); Katsumi Okamura, Itami (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 75 days.

(21) Appl. No.: 15/032,976

(22) PCT Filed: Sep. 19, 2014

(86) PCT No.: PCT/JP2014/074821
§ 371 (c)(1),
(2) Date: Apr. 28, 2016

(87) PCT Pub. No.: WO2015/064241
PCT Pub. Date: May 7, 2015

(65) Prior Publication Data
US 2016/0265098 A1 Sep. 15, 2016

(30) Foreign Application Priority Data
Oct. 31, 2013 (JP) ................. 2013-227077

(51) Int. Cl.
*B23B 27/14* (2006.01)
*C23C 14/06* (2006.01)
(Continued)

(52) U.S. Cl.
CPC ........ *C23C 14/0647* (2013.01); *B23B 27/148* (2013.01); *C04B 35/58007* (2013.01);
(Continued)

(58) Field of Classification Search
USPC .......... 51/307, 309; 428/216, 336, 697, 698, 428/699, 704
See application file for complete search history.

(56) References Cited

U.S. PATENT DOCUMENTS 5,330,853 A * 7/1994 Hofmann ............ C23C 14/0084
51/307
2006/0269789 A1* 11/2006 Toihara ............ C04B 35/58007
428/698

(Continued)

FOREIGN PATENT DOCUMENTS

CN 1942274 A 4/2007
CN 101400465 A 4/2009
(Continued)

OTHER PUBLICATIONS

International Search Report in PCT International Application No. PCT/JP2014/074821, dated Jan. 6, 2015.

*Primary Examiner* — Archene Turner
(74) *Attorney, Agent, or Firm* — Venable LLP; Michael A. Sartori; Kerri M. Patterson

(57) ABSTRACT

A surface-coated boron nitride sintered body tool includes a cubic boron nitride sintered body and a coating film formed thereon. The coating film includes an A layer and a C layer. The A layer is formed of $Ti_{1-xa}Ma_{xa}C_{1-ya}N_{ya}$ (where Ma is one or more of Cr, Nb and W; $0 \leq xa \leq 0.7$; $0 \leq ya \leq 1$). The C layer is formed of $Al_{1-(xc+yc)}Cr_{xc}Mc_{yc}N$ (where Mc is one or more of Ti, V and Si; $0.2 \leq xc \leq 0.8$; $0 \leq yc \leq 0.6$; $0.2 \leq xc+yc \leq 0.8$). The A layer is formed on an outermost surface of the coating film or between the outermost surface of the coating film and the C layer. A distance between the outermost surface of the coating film and an upper surface of the C layer is 0.1 μm or more and 1.0 μm or less.

11 Claims, 2 Drawing Sheets

(51) Int. Cl.
*C04B 41/89* (2006.01)
*C04B 41/00* (2006.01)
*C04B 41/52* (2006.01)
*C04B 35/58* (2006.01)
*C04B 35/5831* (2006.01)
*C23C 14/24* (2006.01)

(52) U.S. Cl.
CPC .... *C04B 35/58021* (2013.01); *C04B 35/5831* (2013.01); *C04B 41/009* (2013.01); *C04B 41/52* (2013.01); *C04B 41/89* (2013.01); *C23C 14/0641* (2013.01); *C23C 14/0664* (2013.01); *C23C 14/24* (2013.01); *B23B 2226/125* (2013.01); *B23B 2228/105* (2013.01)

(56) References Cited

U.S. PATENT DOCUMENTS

| | | | |
|---|---|---|---|
| 2007/0184306 A1* | 8/2007 | Yamamoto | C23C 14/06 428/697 |
| 2007/0218313 A1 | 9/2007 | Okada et al. | |
| 2009/0130434 A1 | 5/2009 | Zhu et al. | |
| 2009/0252973 A1* | 10/2009 | Cremer | C23C 14/0641 428/446 |
| 2012/0090247 A1 | 4/2012 | Miura | |
| 2012/0282050 A1 | 11/2012 | Setoyama et al. | |
| 2013/0108850 A1 | 5/2013 | Kudo et al. | |

FOREIGN PATENT DOCUMENTS

| | | | |
|---|---|---|---|
| CN | 102666437 A | | 9/2012 |
| EP | 3023180 A1 | | 5/2016 |
| JP | H09-323204 A | | 12/1997 |
| JP | 2008-18506 A | | 1/2008 |
| JP | 2008-279563 A | | 11/2008 |
| JP | 2009-248238 A | | 10/2009 |
| JP | 2012-024854 | * | 2/2012 |
| WO | WO-2010/150335 A1 | | 12/2010 |
| WO | WO-2012/005275 A1 | | 1/2012 |

* cited by examiner

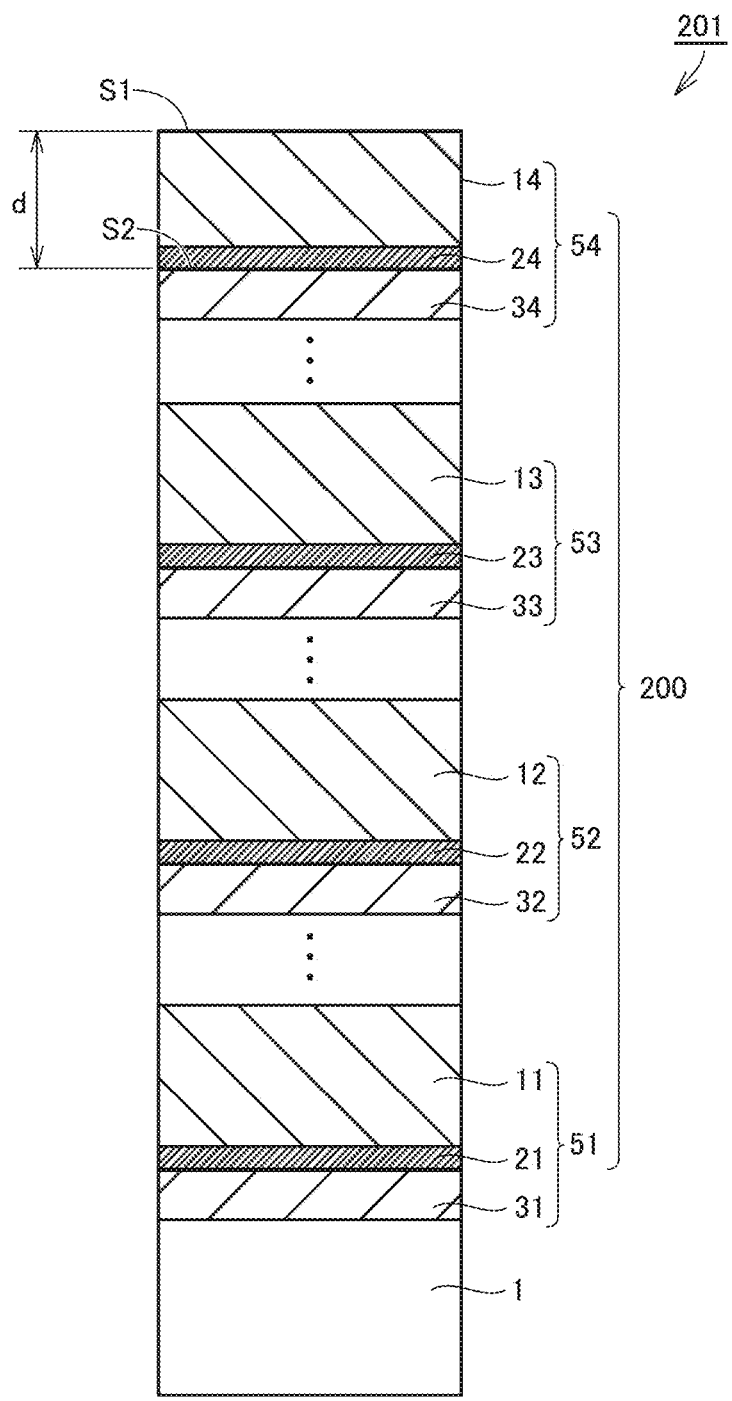

US 10,030,299 B2

SURFACE-COATED BORON NITRIDE SINTERED BODY TOOL

TECHNICAL FIELD

The present invention relates to a surface-coated boron nitride sintered body tool.

BACKGROUND ART

There is a cutting tool formed of a cubic boron nitride sintered body (which will be hereinafter also referred to as a "cBN (cubic Boron Nitride) sintered body") as a base member having a surface on which a coating film is formed. Such a cutting tool is used, for example, for processing a difficult-to-cut material such as hardened steel. For example, WO2010/150335 (PTD 1) and WO2012/005275 (PTD 2) each discloses a tool formed of a cBN sintered body having a surface coated with a coating film formed of multiple layers of ceramics.

CITATION LIST

Patent Document

PTD 1: WO2010/150335
PTD 2: WO2012/005275

SUMMARY OF INVENTION

Technical Problem

Cutting tools have been recently required to have high processing precision. For example, for cutting processing of hardened steel, processing precision equivalent to that of grinding processing may be required. Specifically, a precision component required to have finished surface roughness of 3.2 Z defined by ten-point average roughness (Rzjis) is also processed by cutting. The cutting tool used for such applications is determined as having reached the end of its life at the point of time when a prescribed finished surface roughness cannot be maintained.

Conventionally, cutting tools have been improved in wear resistance and the like, for example, by forming a coating film on the surface of the base member as disclosed in PTD 1 and PTD 2. These techniques, however, do not improve the finished surface roughness of a work material. Furthermore, for a cutting tool made using a cBN sintered body, a coating film capable of improving the finished surface roughness of the work material has not been developed until now.

In consideration of the above problems, the present invention aims to provide a surface-coated boron nitride sintered body tool having excellent processing precision.

Solution to Problem

A surface-coated boron nitride sintered body tool includes a cubic boron nitride sintered body and a coating film formed thereon. The coating film includes an A layer and a C layer. The A layer is formed of $Ti_{1-xa}Ma_{xa}C_{1-ya}N_{ya}$ (where Ma is one or more of Cr, Nb and W; xa is 0≤xa≤0.7; and ya is 0≤ya≤1). The C layer is formed of $Al_{1-(xc+yc)}Cr_{xc}Mc_{yc}N$ (where Mc is one or more of Ti, V and Si; xc is 0.2≤xc≤0.8; yc is 0≤yc≤0.6; and xc+yc is 0.2≤xc+yc≤0.8). The A layer is formed on an outermost surface of the coating film or between the outermost surface of the coating film and the C layer. A distance between the outermost surface of the coating film and an upper surface of the C layer is 0.1 μm or more and 1.0 μm or less.

Advantageous Effects of Invention

According to the above description, a surface-coated boron nitride sintered body tool having excellent processing precision is provided.

BRIEF DESCRIPTION OF DRAWINGS

FIG. 2 is a schematic cross-sectional view showing another example of the configuration of the surface-coated boron nitride sintered body tool according to one embodiment of the present invention.

DESCRIPTION OF EMBODIMENTS

Figure 1:
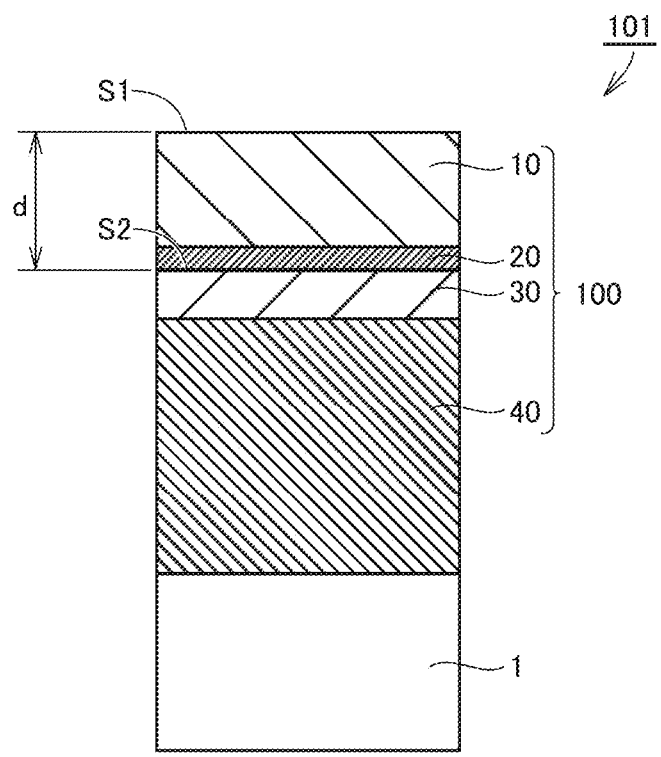
FIG. 1 is a schematic cross-sectional view showing an example of the configuration of a surface-coated boron nitride sintered body tool according to one embodiment of the present invention.

Description of Embodiments of the Invention of the Present Application

First, the outline of one embodiment of the present invention (which will be hereinafter also referred to as the "present embodiment") will be hereinafter described by listing (1) to (11) as set forth below.

When the present inventors have conducted detailed analysis of the damaged state of the tool that was determined as having reached the end of its life during high precision processing, the following results were clarified. Specifically, in the cutting edge of such a tool, in addition to conventionally known crater wear and flank face wear, boundary wear developed in a front boundary portion corresponding to one end of a wear portion. This boundary wear developed in a locally long and sharp shape, unlike the shape and the manner of wear that develops in a recessed shape across a wide range like crater wear or flank face wear. Also, it was found that the shape of this boundary wear was transferred onto a work material, thereby deteriorating the finished surface roughness.

Based on the above-described findings, the present inventors have conducted earnest studies about a method of improving the finished surface roughness of the work material. As a result of these studies, the present inventors have found that a ceramic layer having a specific composition could suppress development of boundary wear, and further conducted repeated studies, thereby completing the present embodiment. Specifically, the surface-coated boron nitride sintered body tool of the present embodiment has a configuration as described below.

(1) A surface-coated boron nitride sintered body tool of the present embodiment includes a cubic boron nitride sintered body and a coating film formed thereon. The coating film includes an A layer and a C layer. The A layer is formed of $Ti_{1-xa}Ma_{xa}C_{1-ya}N_{ya}$ (where Ma is one or more of Cr (chromium), Nb (niobium) and W (tungsten); xa is 0≤xa≤0.7; and ya is 0≤ya≤1). The C layer is formed of $Al_{1-(xc+yc)}Cr_{xc}Mc_{yc}N$ (where Mc is one or more of Ti (titanium), V (vanadium) and Si (silicon); xc is 0.2≤xc≤0.8; yc is 0≤yc≤0.6; and xc+yc is 0.2≤xc+yc≤0.8). The A layer is formed on an outermost surface of the coating film or between the outermost surface of the coating film and the C layer. A distance between the outermost surface of the coating film and an upper surface of the C layer is 0.1 μm or more and 1.0 μm or less.

According to the studies conducted by the present inventors, the C layer formed of $Al_{1-(xc+yc)}Cr_{xc}Mc_{yc}N$ mentioned above serves to suppress development of boundary wear. Also, in the present embodiment, the distance from the outermost surface of the coating film to the upper surface of the C layer is 0.1 μm or more and 1.0 μm or less. Thereby, the maximum length of the boundary wear in the early stage of cutting can be restricted to a specific value or less. As described above, the shape of the boundary wear exerts a direct influence upon the finished surface roughness of the work material. Therefore, restricting the maximum length of boundary wear to a specific value or less means that the magnitude of the finished surface roughness of the work material can be restricted to a specific value or less.

Furthermore, the coating film of the present embodiment includes an A layer on the C layer, in which the A layer is formed of the above-mentioned $Ti_{1-xa}Ma_{xa}C_{1-ya}N_{ya}$. The A layer is relatively less effective in suppressing boundary wear, but smoothly wears out while slowing development of crater wear and flank face wear. The A layer is disposed on the C layer, thereby suppressing occurrence of undulations caused by development of crater wear and flank face wear, so that the finished surface roughness can be improved. Furthermore, the A layer and the C layer act synergistically, so that the wear resistance occurring in a region from the outermost surface to the C layer can also be improved.

In the manner as described above, the surface-coated boron nitride sintered body tool of the present embodiment can be provided with excellent processing precision and wear resistance.

(2) It is preferable that the distance between the outermost surface of the coating film and the upper surface of the C layer is 0.3 μm or more and 0.7 μm or less. Thereby, the finished surface roughness is further improved.

(3) It is preferable that the C layer has a thickness of 0.1 μm or more and 1.0 μm or less. By the C layer having such a thickness, the function of suppressing development of boundary wear tends to be improved.

(4) It is preferable that the coating film includes a plurality of the A layers and a plurality of the C layers, and includes two or more laminated units each having the A layer disposed on the C layer.

As described above, according to the surface-coated boron nitride sintered body tool of the present embodiment, the A layers and the C layers are laminated in specific order, so that development of crater wear and flank face wear and also development of boundary wear can be suppressed, thereby improving the processing precision.

Therefore, as the coating film repeatedly includes laminated units as described above, excellent processing precision can be maintained for a relatively longer period of time. In other words, the tool life defined on the basis of the finished surface roughness (which will be hereinafter referred to as a "surface roughness life") can be improved.

(5) It is preferable that the coating film further includes a B layer between the A layer and the C layer, and the B layer contains one or more compounds formed of: one or more elements selected from the group consisting of Al (aluminum), Cr and Ti; and N (nitrogen).

The compound forming the B layer as described above is formed of elements included in the A layer and the C layer. Accordingly, the B layer has a relatively higher affinity for each of the A layer and the C layer, and therefore, can closely and firmly adhere to each of the layers. Therefore, the B layer is formed between the A layer and the C layer, thereby improving the adhesiveness between the A layer and the C layer, so that peeling between these layers can be prevented.

(6) It is preferable that the B layer includes a multilayer structure formed by alternately laminating one or more B1 layers each formed of TiN and one or more B2 layers each formed of AlCrN. Thereby, the adhesiveness between the A layer and the C layer can be improved.

(7) It is preferable that the B1 layers and the B2 layers each have a thickness of 0.5 nm or more and less than 30 nm. The B layer is formed by a super-multilayer structure formed of a thin B1 layer and a thin B2 layer, so that the adhesiveness between the A layer and the C layer can be improved.

(8) It is preferable that the B layer contains a compound formed of AlTiCrN. AlTiCrN is a compound having a composition that is almost intermediate between the compositions of the compounds constituting the A layer and the C layer. Therefore, this AlTiCrN is particularly suitable as a compound constituting the B layer functioning to increase the adhesiveness between the A layer and the C layer.

(9) It is preferable that the A layer includes a region in which the ya changes in a slope-like manner or in a step-like manner in a thickness direction of the A layer. Thereby, the coating film can be provided with fracture resistance and the like.

(10) It is preferable that the C layer is in contact with the cubic boron nitride sintered body. The C layer formed of $Al_{1-(xc+yc)}Cr_{xc}Mc_{yc}N$ has relatively higher affinity for the cBN sintered body forming a base member. Therefore, the C layer is provided so as to be in contact with the cBN sintered body, so that the adhesiveness between the base member and the coating film can be improved.

(11) It is preferable that the coating film has a thickness of 0.5 μm or more and 10 μm or less. Thereby, the tool life can be improved.

Details of Embodiments of the Invention of the Present Application

Although the surface-coated boron nitride sintered body tool according to the present embodiments will be hereinafter described in detail, the present embodiments are not limited thereto.

First Embodiment

Surface-Coated Boron Nitride Sintered Body Tool

FIG. 1 is a schematic cross-sectional view showing an example of the configuration of a surface-coated boron nitride sintered body tool (which will be hereinafter referred to as a "surface-coated cBN tool") according to the first embodiment. As shown in FIG. 1, a coated cBN tool 101 includes a base member 1 formed of a cBN sintered body and a coating film 100 formed thereon. Coating film 100 includes an A layer 10 and a C layer 30. Coating film 100 has an outermost surface S1, and C layer 30 has an upper surface S2.

The A layer 10 is formed of $Ti_{1-xa}Ma_{xa}C_{1-ya}N_{ya}$ (where Ma is one or more of Cr, Nb and W; xa is 0≤xa≤0.7; and ya is 0≤ya≤1), and has a function of smoothly wearing out while slowing development of crater wear and flank face wear (that is, crater wear resistance and flank face wear resistance).

Furthermore, C layer 30 is formed of $Al_{1-(xc+yc)}Cr_{xc}Mc_{yc}N$ (where Mc is one or more of Ti, V and Si; xc is 0.2≤xc≤0.8; yc is 0≤yc≤0.6; and xc+yc is 0.2≤xc+yc≤0.8), and has a function of suppressing development of boundary wear (that is, boundary wear resistance).

The A layer 10 is formed on outermost surface S1 of coating film 100. In the present embodiment, A layer 10 only has to be formed on the side closer to outermost surface S1 than upper surface S2 of C layer 30, and does not have to be formed on outermost surface S1. For example, another layer (a coloring layer and the like formed of TiN or the like) may be formed on A layer 10. In other words, A layer 10 in the present embodiment is formed on outermost surface S1 of the coating film or between outermost surface S1 and upper surface S2 of C layer 30.

A distance d between outermost surface S1 of coating film 100 and upper surface S2 of C layer 30 is 0.1 µm or more and 1.0 µm or less. Thereby, the maximum length of the boundary wear in the early stage of cutting is restricted to a constant value or less. Furthermore, A layer 10 is formed on C layer 30, thereby suppressing occurrence of undulations caused by development of crater wear and flank face wear, so that the finished surface roughness of the work material can be maintained excellently. In addition, it is more preferable that distance d is 0.3 µm or more and 0.7 µm or less.

In this case, distance d between outermost surface S1 and upper surface S2 of C layer 30 is assumed to be measured as described below. Specifically, distance d is to be measured by observing a cross section, which is obtained by cutting the coated cBN tool, with a scanning electron microscope (SEM) or a transmission electron microscope (TEM). The sample for cross-section observation can be produced, for example, using a focused ion beam system (FIB), a cross section polisher (CP), and the like. In addition, this measurement method is to be applied also to measurement of the thickness of the coating film itself or the thickness of each of layers forming the coating film.

Furthermore, the composition of each of layers forming a coating film is assumed to be measured by an energy dispersive X-ray spectroscopy (EDX) attached to the SEM or the TEM.

Each of parts constituting coated cBN tool 101 will be hereinafter described.

<Coating Film>

Coating film 100 includes A layer 10 and C layer 30. Coating film 100 may include other layers as long as it includes A layer 10 and C layer 30. For example, a B layer 20 (adhesion layer) described later and the like may be included between A layer 10 and C layer 30 as shown in FIG. 1, or a D layer 40 described later may be included between C layer 30 and base member 1.

It is preferable that coating film 100 has a thickness of 0.5 µm or more and 10 µm or less. As the coating film has a thickness of 0.5 µm or more, a shortened tool life-span resulting from the thinness of the coating film can be prevented.

Furthermore, as the coating film has a thickness of 10 µm or less, the chipping resistance in the early stage of cutting can be improved. The thickness of the coating film is more preferably 1.0 µm or more and 5.0 µm or less.

<A Layer>

The A layer 10 is formed of $Ti_{1-xa}Ma_{xa}C_{1-ya}N_{ya}$ (where Ma is one or more of Cr, Nb and W; xa is $0 \le xa \le 0.7$; and ya is $0 \le ya \le 1$). Thereby, the A layer is provided with crater wear resistance and flank face wear resistance, thereby suppressing occurrence of undulations caused by development of crater wear and flank face wear, so that the finished surface roughness of the work material can be maintained excellently.

In this case, xa is preferably $0 \le xa \le 0.5$, more preferably $0 \le xa \le 0.3$, and further more preferably $0 \le xa \le 0.2$. This is because xa falls within the above-mentioned range, so that the wear resistance tends to be improved. Similarly, from the viewpoint of wear resistance, ya is preferably $0.1 \le ya \le 0.9$, more preferably $0.2 \le ya \le 0.8$, and further more preferably $0.3 \le ya \le 0.7$.

The thickness of A layer 10 is preferably 0.1 µm or more and 0.7 µm or less, more preferably 0.2 µm or more and 0.6 µm or less, and further more preferably 0.3 µm or more and 0.5 µm or less. This is because the thickness of A layer 10 falls within the above-mentioned range, so that the flank face wear resistance tends to be improved.

(Region of Change in Slope-Like or Step-Like Manner)

It is preferable that A layer 10 ($Ti_{1-xa}Ma_{xa}C_{1-ya}N_{ya}$) includes a region in which the value of ya changes in a slope-like manner or in a step-like manner in the thickness direction of the A layer (for example, in the longitudinal direction in FIG. 1 and the like). For example, in the case where ya is relatively large on the base member 1-side of A layer 10, the fracture resistance and the peeling resistance tend to be improved. Also, for example, in the case where the value of ya is relatively small on the upper surface-side of the A layer, peeling, cracking, chipping and the like in A layer 10 during wear can be prevented.

The expression that "the value of ya changes in a slope-like manner in the thickness direction of the A layer" used herein means that the value of ya continuously decreases or increases from the lower surface of A layer 10 toward the upper surface of A layer 10. Such a configuration is obtained, for example, by continuously changing the flow rate ratio between raw material gas of N (Nitrogen) and raw material gas of C (Carbon) when the A layer is formed by the arc ion plating (AIP) method.

Also, the expression that "the value of ya changes in a step-like manner in the thickness direction of the A layer" used herein means that the value of ya discontinuously decreases or increases from the lower surface of A layer 10 toward the upper surface of A layer 10. Such a configuration is obtained, for example, by laminating two or more layers having ya of different values.

<C Layer>

C layer 30 is formed of $Al_{1-(xc+yc)}Cr_{xc}Mc_{yc}N$ (where Mc is one or more of Ti, V and Si; xc is $0.2 \le xc \le 0.8$; yc is $0 \le yc \le 0.6$; and xc+yc is $0.2 \le xc+yc \le 0.8$). Thereby, the C layer is provided with boundary wear resistance.

In this case, yc is preferably $0 \le yc \le 0.4$, more preferably $0 \le yc \le 0.3$, and further more preferably $0 \le yc \le 0.2$. The studies conducted by the present inventors show the result that the boundary wear resistance is more excellent as the C layer contains less Ti, V and Si. Therefore, yc=0 is most preferable. Furthermore, xc+yc is preferably $0.2 \le xc+yc \le 0.6$, and more preferably $0.2 \le xc+yc \le 0.4$.

It is preferable that the C layer has a thickness of 0.1 µm or more and 1.0 µm or less. Thereby, development of boundary wear can be further more reliably prevented. In addition, the thickness of the C layer is more preferably 0.1 µm or more and 0.7 µm or less, and further more preferably 0.1 µm or more and 0.5 µm or less.

<B Layer>

Coating film 100 shown in FIG. 1 has a B layer 20 as an adhesion layer between A layer 10 and C layer 30. Thereby, peeling between A layer 10 and C layer 30 is prevented. It is preferable that B layer 20 contains one or more compounds formed of: one or more elements selected from the group consisting of Al, Cr and Ti; and N. Such a compound has relatively higher affinity for each of A layer 10 and C layer 30, and can closely and firmly adhere to each of the layers. The thickness of B layer 20 is preferably 0.005 μm or more and 0.7 μm or less, more preferably 0.1 μm or more and 0.6 μm or less, and further more preferably 0.1 μm or more and 0.4 μm or less.

As a specific configuration, B layer 20 can be formed, for example, as a multilayer structure obtained by alternately laminating one or more B1 layers (not shown) each formed of TiN and one or more B2 layers (not shown) each formed of AlCrN. Thereby, B layer 20 can be entirely formed to have a relatively higher affinity for each of A layer 10 and C layer 20. Consequently, B layer 20 can also contribute to improvement in crater wear resistance and flank face wear resistance.

In the configuration described above, the B1 layer and the B2 layer each can be formed to have a thickness of 0.5 nm or more and less than 30 nm. Such thin B1 layers and thin B2 layers are alternately laminated, so that A layer 10 and C layer 30 can be further firmly and closely adhered to each other. In the case where B layer 20 has a multilayer structure, the number of laminated layers (the total number of B1 layers and B2 layers) is, for example, 4 or more and 50 or less, preferably 8 or more and 40 or less, and more preferably 10 or more and 20 or less. Also from the viewpoint of further increasing the adhesiveness, it is preferable that B1 layers and B2 layers are alternately laminated such that a B1 layer (TiN layer) is in contact with A layer 10 while a B2 layer (AlCrN layer) is in contact with the C layer.

Furthermore, B layer 20 may have a single-layer structure. In this case, it is preferable that B layer 20 contains a compound formed of AlTiCrN. Since AlTiCrN is a compound having a composition that is almost intermediate between the compositions of the compounds constituting A layer 10 and C layer 30. Accordingly, sufficient adhesiveness can be achieved even if B layer 20 is a single layer.

<D Layer>

As shown in FIG. 1, coating film 100 may include D layer 40 between C layer 30 and base member 1. D layer 40 can be formed, for example, of $MdLd_{zd}$ (Md is one or more of group 4 elements, group 5 elements and group 6 elements in the periodic table, Al, and Si; Ld is one or more of B (boron), C, N, and O (oxygen); and zd is $0 \leq zd \leq 1.0$). By forming such D layer 40, the adhesiveness between coating film 100 and base member 1 is improved while a shortened tool life-span resulting from thinness of coating film 100 can be prevented. The thickness of D layer 40 is, for example, 0.5 m or more and 3.0 μm or less, and preferably 1.0 μm or more and 2.0 μm or less.

<cBN Sintered Body>

The cBN sintered body of the present embodiment forms base member 1 of coated cBN tool 101 in a cutting edge portion of this tool 101. The cBN sintered body only has to be provided in the cutting edge portion of coated cBN tool 101. In other words, the base member of the coated cBN tool may include a cutting edge portion formed of a cBN sintered body, and a base member main body made of a material different from that of the cBN sintered body (for example, cemented carbide). In this case, it is preferable that the cutting edge portion formed of a cBN sintered body is bonded to the base member main body with a braze material and the like. The braze material may be selected as appropriate in consideration of the bonding strength and the melting point. The cBN sintered body may constitute the entire base member of coated cBN tool 101.

It is preferable that the cBN sintered body includes 30 vol % or more and 80 vol % or less of cBN particles, and further includes a binder phase as the remainder.

In this case, it is preferable that the binder phase includes: at least one compound selected from the group consisting of nitride, carbide, boride, and oxide of group 4 elements, group 5 elements, and group 6 elements in the periodic table, and solid solutions thereof in an aluminum compound; and inevitable impurities. The binder phase binds the cBN particles to each other in the sintered body structure. As 30 vol % or more of cBN particles are contained in the sintered body structure, a decrease in wear resistance of the cBN sintered body can be prevented. Furthermore, as 80 vol % or less of cBN particles are contained, the cBN particles that are excellent in strength and toughness can serve as a skeletal structure in the sintered body structure, so that the fracture resistance of the cBN sintered body can be ensured.

In the present specification, the volume content of the cBN particles is to be measured by the method described below. Specifically, a cBN sintered body is mirror-polished, and the backscattered electron image of the cBN sintered body structure in an arbitrary region is observed by using the SEM at 2000 times magnification. In this case, the cBN particles are observed as a black area while the binder phase is observed as a gray area or a white area. In an observation view image, the cBN particle region and the binder phase region are binarized by image processing to measure the occupancy area of the cBN particle region. Then, the occupancy area is substituted into the following equation, so that the volume content of the cBN particles can be calculated.

(Volume content of cBN particles)=(occupancy area of cBN particles)÷(area of cBN sintered body structure in view image)×100.

It is more preferable that the volume content of the cBN particles is 50 vol % or more and 75 vol % or less. As the volume content of the cBN particles is 50 vol % or more, the coated cBN tool tends to exhibit an excellent balance between the wear resistance and the fracture resistance. Furthermore, as the volume content of the cBN particles is 75 vol % or less, the binder phase is to be distributed appropriately, so that the bonding strength between the cBN particles by the binder phase tends to increase. In addition, the volume content of the cBN particles is particularly preferably 50 vol % or more and 60 vol % or less.

Second Embodiment

The second embodiment of the present embodiments will be hereinafter described. FIG. 2 is a schematic cross-sectional view showing one example of the configuration of a coated cBN tool according to the second embodiment. As shown in FIG. 2, a coated cBN tool 201 according to the second embodiment includes a base member 1 formed of a cBN sintered body and a coating film 200 formed thereon. Furthermore, coating film 200 includes a plurality of A layers (a first A layer 11, a second A layer 12, a third A layer 13, and a fourth A layer 14), and a plurality of C layers (a first C layer 31, a second C layer 32, a third C layer 33, and a fourth C layer 34). Also, coating film 200 includes four laminated units each having an A layer disposed on a C layer.

As in the first embodiment, the thickness of coating film 200 is preferably 0.5 m or more and 10 μm or less, and more preferably 1.0 μm or more and 5.0 μm or less. The configuration shown in FIG. 2 is merely by way of example, and the number of laminated units included in the coating film in the present embodiment may be one (the first embodiment), may be two to three, or may be five or more.

In this case, first A layer 11, second A layer 12, third A layer 13, and fourth A layer 14 can be formed in the same configuration as that of A layer 10 described in the first embodiment. However, first A layer to fourth A layer may be different in thickness and composition from one another. For example, third A layer 13 (the second A layer from the outermost surface S1-side) may be formed thicker than fourth A layer 14 (the A layer closest to outermost surface S1). This is because development of boundary wear is once inhibited by fourth C layer 34 in fourth laminated unit 54, and therefore, the development speed of boundary wear in third laminated unit 53 may also be different from that in fourth laminated unit 54.

Furthermore, first C layer 31, second C layer 32, third C layer 33, and fourth C layer 34 can also be formed in the same configuration as that of C layer 30 described in the first embodiment. These C layers may be different in thickness and composition from one another.

In the second embodiment, fourth A layer 14 constitutes outermost surface S1 of the coating film. In other words, fourth A layer 14 is formed on outermost surface S1 of coating film 200. Also, a distance d between outermost surface S1 of coating film 200 and upper surface S2 of fourth C layer 34 is 0.1 µm or more and 1.0 µm or less. Thereby, the finished surface roughness of the work material can be improved in the same manner as in the first embodiment.

In the case where the coating film includes a plurality of C layers as in the second embodiment, distance d between outermost surface S1 of the coating film and upper surface S2 of the C layer is assumed to represent the distance between outermost surface S1 and upper surface S2 of the C layer closest to outermost surface S1 among a plurality of C layers. Also, another layer may be formed on fourth A layer 14 as in the first embodiment.

Furthermore, coating film 200 includes four laminated units (a first laminated unit 51, a second laminated unit 52, a third laminated unit 53, and a fourth laminated unit 54) each having an A layer disposed on a C layer. Consequently, excellent finished surface roughness can be maintained for a long period of time, thereby providing an excellent surface roughness life. In other words, even if fourth laminated unit 54 disappears due to wear, third laminated unit 53 to first laminated unit 51 still have the same effects. Accordingly, developments of boundary wear and flank face wear can be still suppressed.

In coating film 200, B layers (a first B layer 21, a second B layer 22, a third B layer 23, and a fourth B layer 24) are formed between the A layers and the C layers, respectively. Thereby, the adhesiveness within each laminated unit is increased, so that the surface roughness life is increased.

It is to be noted that an optional layer may be included between laminated units. For example, in the case where first laminated unit 51 and second laminated unit 52 are formed adjacent to each other, it is preferable that a B layer (adhesion layer) is provided also between first A layer 11 and second C layer 32. Consequently, the adhesiveness between the laminated units is increased, so that the surface roughness life can be further increased.

As shown in FIG. 2, it is preferable that the C layer (first C layer 31 in FIG. 2) is in contact with base member 1. The C layer having the above-described composition is excellent in adhesiveness to the cBN sintered body. Accordingly, as the C layer is in contact with base member 1, falling-off and peeling of the entire coating film 200 can be prevented.

<Method of Manufacturing Surface-Coated Boron Nitride Sintered Body Tool>

The coated cBN tool of the present embodiment described above can be manufactured as set forth below.

<Fabrication of Base Member>

The base member of the present embodiment can be manufactured by bonding a base member main body and a base member formed of a cBN sintered body. The base member main body can be made using a material, for example, cemented carbide.

Such a base member main body can be manufactured, for example, by the conventionally known sintering method and molding method. Furthermore, the base member formed of a cBN sintered body can be manufactured, for example, by sintering a mixture made of cBN particles and raw material powder of a binder phase under high-temperature and high-pressure conditions. Then, the base member formed of a cBN sintered body is bonded with the conventionally known braze material to an appropriate portion of the base member main body, which is then subjected to grinding processing so as to be formed into a prescribed shape, with the result that the base member can be manufactured. It is a matter of course that the entire base member is formed of a cBN sintered body.

<Formation of Coating Film>

A coating film is formed on the base member obtained as described above, so that a coated cBN tool can be manufactured. In this case, it is preferable that the coating film is formed by the arc ion plating method (AIP method: the ion plating method for evaporating a solid material by utilizing vacuum arc discharge) or by the sputtering method. According to the AIP method, a coating film can be formed using: a metal evaporation source containing metal species for forming a coating film; and reaction gas such as $CH_4$, $N_2$ or $O_2$. In addition, the conditions for forming a coating film can be conventionally known conditions. According to the sputtering method, a coating film can be formed using: a metal evaporation source containing metal species for forming a coating film; reaction gas such as $CH_4$, $N_2$, or $O_2$; and sputtering gas such as Ar, Kr, and Xe. Also in this case, the conditions for forming a coating film can be conventionally known conditions.

EXAMPLES

Although the present embodiments will be hereinafter described in greater detail with reference to Examples, the present embodiments are not limited thereto. In the following description, for example, first A layer 11, second A layer 12 and the like may be collectively simply referred to as an A layer.

Example 1

Manufacture of cBN Sintered Body

As described below, cBN sintered bodies A to H each having a composition shown in Table 1 were manufactured. Each compound shown in the column of "X-ray Detecting Compound" in Table 1 is a compound detected when qualitatively analyzing the cross section or the surface of the cBN sintered body by an X-ray diffraction (XRD) apparatus.

TABLE 1

| cBN Sintered Body | cBN Particle | | Raw Material Powder of Binder Phase | X-ray Detecting Compound |
|---|---|---|---|---|
| | Volume Content/ Vol % | Average Particle Size/µm | | |
| A | 30 | 1.5 | $TiN_{0.6}$, Al | cBN, TiN, $TiB_2(AlB_2)$ |
| B | 80 | 2.0 | $TiN_{0.6}$, Al | cBN, TiN, $TiB_2(AlB_2)$ |
| C | 50 | 1.5 | $TiN_{0.6}$, Al | cBN, TiN, $TiB_2(AlB_2)$ |
| D | 60 | 2.0 | $TiN_{0.6}$, Al | cBN, TiN, $TiB_2(AlB_2)$ |
| E | 75 | 3.0 | $TiN_{0.6}$, Al | cBN, TiN, $TiB_2(AlB_2)$ |
| F | 50 | 0.5 | $TiN_{0.6}$, Al | cBN, TiN, $TiB_2(AlB_2)$ |

TABLE 1-continued

| | cBN Particle | | | |
|---|---|---|---|---|
| cBN Sintered Body | Volume Content/ Vol % | Average Particle Size/μm | Raw Material Powder of Binder Phase | X-ray Detecting Compound |
| G | 50 | 2.0 | TiC$_{0.6}$, Al | cBN, TiC, TiB$_2$(AlB$_2$) |
| H | 50 | 2.0 | TiC$_{0.3}$N$_{0.5}$, Al | cBN, TiCN, TiB$_2$(AlB$_2$) |

(Manufacture of cBN Sintered Body A)

First, a mixture was obtained by mixing TiN powder having an average particle size of 1 μm and Ti powder having an average particle size of 3 μm in an atomic ratio of Ti:N=1:0.6. This mixture was heat-treated for 30 minutes at 1200° C. in a vacuum and then ground. Thereby, intermetallic compound powder made of TiN$_{0.6}$ was obtained.

Then, a mixture was obtained by mixing intermetallic compound powder made of TiN$_{0.6}$ and Al powder having an average particle size of 4 μm in a mass ratio of TiN$_{0.6}$:Al=90:10. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained.

Then, cBN particles having an average particle size of 1.5 μm and raw material powder of the binder phase were blended so as to achieve 30 vol % of the content of the cBN particles in the cBN sintered body, and then, uniformly mixed by the ball mill mixing method using ball media made of boron nitride and having a diameter of 3 mm, thereby obtaining powdery mixture. Then, this mixture was stacked on a support substrate made of cemented carbide, and then introduced into a capsule made of Mo, which was then sintered for 30 minutes at pressure of 5.5 GPa and at a temperature of 1300° C. using an ultra-high pressure apparatus. Thereby, a cBN sintered body A was obtained.

(Manufacture of cBN Sintered Bodies B to F)

Then, cBN sintered bodies B to F were obtained in the same manner as with cBN sintered body A, except that cBN particles having different volume contents and different average particle sizes as shown in Table 1 were used.

(Manufacture of cBN Sintered Body G)

First, a mixture was obtained by mixing TiC powder having an average particle size of 1 μm and Ti powder having an average particle size of 3 μm in an atomic ratio of Ti:C=1:0.6. Then, this mixture was heat-treated for 30 minutes at 1200° C. in a vacuum and then ground. Thereby, intermetallic compound powder made of TiC$_{0.6}$ was obtained.

Then, a mixture was obtained by mixing intermetallic compound powder made of TiC$_{0.6}$ and Al powder having an average particle size of 4 μm in a mass ratio of TiC$_{0.6}$:Al=95:5. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained. Then, the raw material powder of the binder phase was used to obtain a cBN sintered body G in the same manner as with cBN sintered body A, except that cBN particles having different volume contents and different average particle sizes as shown in Table 1 were used.

(Manufacture of cBN Sintered Body H)

First, a mixture was obtained by mixing TiCN powder having an average particle size of 1 μm and Ti powder having an average particle size of 3 μm in an atomic ratio of Ti:C:N=1:0.3:0.5. Then, this mixture was heat-treated for 30 minutes at 1200° C. in a vacuum and then ground. Thereby, intermetallic compound powder made of TiC$_{0.3}$N$_{0.5}$ was obtained.

Then, a mixture was obtained by mixing intermetallic compound powder made of TiC$_{0.3}$N$_{0.5}$ and Al powder having an average particle size of 4 μm in a mass ratio of TiC$_{0.3}$N$_{0.5}$:Al=95:5. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained. Then, the raw material powder of the binder phase was used to obtain a cBN sintered body H in the same manner as with cBN sintered body A, except that cBN particles having different volume contents and different average particle sizes as shown in Table 1 were used.

<Manufacture of Sample No. 1>

A coated cBN tool according to Sample No. 1 was manufactured as described below.

<Fabrication of Base Member>

A base member main body having a shape of DNGA150408 of the ISO standard and made of a cemented carbide material (equivalent to K10) was prepared.

The above-described cBN sintered body A (shape: a 2-mm-thick triangular prism having isosceles triangles as bases whose vertex angle was 55° and sides sandwiching the vertex angle were each 2 mm) was bonded to an insert (corner portion) of this base member main body. A braze material made of Ti—Zr—Cu was used for bonding. Then, the outer circumferential surface, the upper surface and the lower surface of the bonded body were ground to form a negative land shape (a negative land width of 150 m and a negative land angle of 25°) at the insert. In this way, a base member having a cutting edge portion formed of cBN sintered body A was obtained.

<Formation of Coating Film>

(Film Forming Apparatus)

A film forming apparatus used for forming a coating film will be hereinafter described in the subsequent steps. A vacuum pump is connected to the film forming apparatus, within which a vacuum chamber that can be evacuated is provided. A rotary table is placed inside the vacuum chamber. This rotary table is configured such that the base member can be placed thereon through a jig. The base member placed within the vacuum chamber can be heated by a heater placed inside the vacuum chamber. Also, a gas pipe for introducing gas for etching and film forming is connected to the vacuum chamber through a mass flow controller (MFC) for flow rate control. Furthermore, a tungsten filament for generating Ar ions for etching, or an arc evaporation source or a sputtering source for film formation to which a necessary power supply is connected is disposed within the vacuum chamber. Then, evaporation source raw material (target) required for film formation is placed in the arc evaporation source or the sputtering source.

(Etching of Base Member)

The base member obtained as described above was placed within the vacuum chamber of the film forming apparatus, and the chamber was evacuated. Then, the base member was heated to 500° C. while rotating the rotary table at 3 rpm. Then, Ar gas was introduced into the vacuum chamber, a tungsten filament was discharged to generate Ar ions, a bias voltage was applied to the base member, and the base member was etched by Ar ions. The etching conditions in this case are as described below.

Pressure of Ar gas: 1 Pa

Substrate bias voltage: −500V.

(Formation of A Layer)

Then, an A layer was formed on the base member within the above-described film forming apparatus. Specifically, the A layer having a thickness of 1.7 μm was formed under the conditions described below. In this case, the flow rate of the introduced gas ($N_2$ and $CH_4$) was adjusted so as to be set at C:N=2:8 in the A layer.

Target: Ti
Introduced gas: $N_2$, $CH_4$
Film forming pressure: 2 Pa
Arc discharge current: 180 A
Substrate bias voltage: −350V
Table rotation speed: 3 rpm.

(Formation of B Layer)

Subsequently to the A layer, a B layer was formed on the A layer within the film forming apparatus described above. Specifically, a B1 layer (not shown) made of TiN and a B2 layer (not shown) made of AlCrN were alternately formed each for 5 times repeatedly under the conditions described below, so that a B layer formed of 10 layers in total and having a total thickness of 0.1 μm was formed. When forming the B layer, the vapor deposition time was adjusted to achieve the B1 layer having a thickness of 10 nm and the B2 layer having a thickness of 10 nm. In Sample No. 1, the uppermost layer (the C layer-side) of the B layer is a B2 layer while the lowermost layer thereof (A layer-side) is a B1 layer. The B layer having the same configuration as described above will be hereinafter also referred to as a "$B_0$ layer". Furthermore, in the case where the B layer has a multilayer structure formed of a B1 layer (TiN layer) and a B2 layer (AlCrN layer), the B1 layers and the B2 layers are laminated on the A layer-side and the C layer-side, respectively.

(Formation of B1 Layer)

The B1 layer was formed under the conditions described below.

Target: Ti
Introduced gas: $N_2$
Film forming pressure: 3 Pa
Arc discharge current: 150 A
Substrate bias voltage: −40V.

(Formation of B2 Layer)

The B2 layer was formed under the conditions described below.

Target: Al (50 atom %), Cr (50 atom %)
Introduced gas: $N_2$
Film forming pressure: 3 Pa
Arc discharge current: 150 A
Substrate bias voltage: −50V.

(Formation of C Layer)

Then, the C layer was formed on the B layer. Specifically, the C layer was formed while adjusting the vapor deposition time so as to achieve a thickness of 0.2 μm under the conditions described below.

Target: Al (70 atom %), Cr (30 atom %)
Introduced gas: $N_2$
Film forming pressure: 4 Pa
Arc discharge current: 150 A
Substrate bias voltage: −35V
Table rotation speed: 3 rpm.

The coated cBN tool according to Sample No. 1 was obtained as described above. The outermost surface of the coating film of Sample No. 1 is formed by the C layer.

(Manufacture of Sample No. 2)

The A layer, the B layer, and the C layer were laminated in this order on the base member in the same manner as with Sample No. 1.

(Formation of B Layer)

Then, a B layer having a thickness of 0.1 μm was formed on the C layer in the same manner as described above.

(Formation of A Layer)

Furthermore, an A layer was formed on the B layer in the same manner as described above except that the thickness was set at 0.1 μm. The coated cBN tool according to Sample No. 2 was obtained as described above. The configuration of Sample No. 2 is shown in each of Tables 2 and 3. The A layer is formed on outermost surface S1 of the coating film in Sample No. 2, and distance d between outermost surface S1 and upper surface S2 of the C layer is 0.2 μm.

TABLE 2

| | | Coating Film | | | | | | |
|---|---|---|---|---|---|---|---|---|
| | | | | | B Layer | | | |
| | cBN | A Layer | | Number | | B1 Layer | | B2 Layer |
| Sample No. | Sintered Body | Composition $Ti_{1-xa}Ma_{xa}C_{1-ya}N_{ya}$ | Thickness/ μm | of Layers | Thickness/ μm | Composition | Thickness/ nm | Composition | Thickness/ nm |
| 1 | A | $TiC_{0.2}N_{0.8}$ | 1.7 | 10 | 0.10 | TiN | 10 | AlCrN | 10 |
| 2* | | | | | | | | | |
| 3* | | | | | | | | | |
| 4* | | | | | | | | | |
| 5* | | | | | | | | | |
| 6 | | | | | | | | | |

TABLE 3

| | | | Coating Film | | | | | |
|---|---|---|---|---|---|---|---|---|
| | | | | | | | B Layer | |
| | | Thickness of Entire | A Layer | | Number | | B1 Layer | |
| Sample No. | Distanced/ μm | Coating Film/ μm | Composition $Ti_{1-xa}Ma_{xa}C_{1-ya}N_{ya}$ | Thickness/ μm | of Layers | Thickness/ μm | Composition | Thickness/ nm |
| 1 | 0 | 2.0 | None | — | 0 | 0 | None | |
| 2* | 0.20 | 2.2 | $TiC_{0.2}N_{0.8}$ | 0.10 | 10 | 0.10 | TiN | 10 |
| 3* | 0.45 | 2.45 | | 0.35 | | | | |
| 4* | 0.60 | 2.60 | | 0.50 | | | | |

TABLE 3-continued

| 5* | 0.78 | 2.78 | 0.68 |
| 6  | 1.30 | 3.30 | 1.20 |

|  | Coating Film | | | | Evaluation Results | |
| --- | --- | --- | --- | --- | --- | --- |
|  | B Layer / B2 Layer | | C Layer | | Flank Face Wear | Finished Surface |
| Sample No. | Composition | Thickness/ nm | Composition $Al_{1-(xc+yc)}Cr_{xc}Mc_{yc}N$ | Thickness/ μm | Amount VB/mm | Roughness Rz/μm |
| 1 | None | | $Al_{0.7}Cr_{0.3}N$ | 0.20 | 0.065 | 2.2 |
| 2* | AlCrN | 10 | | | 0.050 | 2.3 |
| 3* | | | | | 0.045 | 2.5 |
| 4* | | | | | 0.041 | 2.6 |
| 5* | | | | | 0.039 | 2.7 |
| 6  | | | | | 0.036 | 3.0 |

(Manufacture of Samples Nos. 3 to 6)

Coated cBN tools according to Samples Nos. 3 to 6 were obtained in the same manner as with Sample No. 2 except that the thickness of the A layer formed on outermost surface S1 was changed as shown in Table 3 by adjusting the vapor deposition time. Each Sample having "No." marked with a symbol "*" in each of Tables 2 and 3 corresponds to each Example (the same applies to the description of Examples described below).

<Evaluations>

The cutting performance and the finished surface roughness of the coated cBN tool according to each of Samples Nos. 1 to 6 obtained as described above were evaluated by continuous cutting of hardened steel.

<Measurement of Flank Face Wear Amount VB and Finished Surface Roughness Rz>

A tool for each Sample was used to perform cutting processing at a cutting distance of 3 km according to the cutting conditions described below. Then, a flank face wear amount VB of the tool was measured using an optical microscope. Furthermore, "ten-point average roughness (Rzjis)" of the work material after processing was measured based on "JIS B 0601". The results are shown in Table 3. In Table 3, the smaller the flank face wear amount VB is, the more excellent the wear resistance is achieved. Also, Table 3 shows that the smaller this Rz is, the more excellent the processing precision is achieved.

(Cutting Conditions)

Work material: hardened steel SCM415H (HRC60), φ 35 mm×10 mm

Cutting speed: 150 m/min
Feed rate: f=0.1 mm/rev
Cutting depth: ap=0.1 mm
Cutting oil: 20-fold diluted emulsion (trade name: "System Cut 96" manufactured by "Japan Fluid System") (wet state).

(Results and Consideration)

Sample No. 1 showed the results that Rz was relatively small but VB was relatively large. It is considered this is because, in Sample No. 1, an A layer was not disposed on the C layer and distance d was less than 0.1 μm. Furthermore, Sample No. 6 showed the results that VB was relatively small and excellent but Rz was relatively large. It is considered this is because distance d exceeded 1.0 μm, thereby increasing development of boundary wear.

In contrast, in Samples Nos. 2 to 5, distance d was 0.1 μm or more and 1.0 μm or less, and both of the wear amount and the finished surface roughness were satisfied.

Specifically, the sample according to Example includes a cubic boron nitride sintered body and a coating film formed thereon, in which the coating film includes an A layer and a C layer, the A layer is formed of $Ti_{1-xa}Ma_{xa}C_{1-ya}N_{ya}$ (where Ma is one or more of Cr, Nb and W; xa is 0≤xa≤0.7; and ya is 0≤ya≤1), the C layer is formed of $Al_{1-(xc+yc)}Cr_{xc}Mc_{yc}N$ (where Mc is one or more of Ti, V and Si; xc is 0.2≤xc≤0.8; yc is 0≤yc≤0.6; and xc+yc is 0.2 xc+yc≤0.8), the A layer is formed on the outermost surface of the coating film or between the outermost surface of the coating film and the C layer, and the distance between the outermost surface of the coating film and the upper surface of the C layer is 0.1 μm or more and 1.0 μm or less. It was confirmed that the above-described sample according to Example had excellent wear resistance and processing precision as compared with samples in Comparative Examples not satisfying the above-described conditions.

Example 2: Review of Configuration of A Layer (Manufacture of Sample No. 7)

A coated cBN tool according to Sample No. 7 was manufactured as described below.

(Fabrication of Base Member)

A base member 1 was obtained in the same manner as in Example 1 except that a cBN sintered body C was used in place of cBN sintered body A.

(Formation of Coating Film)

Referring to FIG. 1, coating film 100 was formed on base member 1 as described below.

(Formation of D Layer)

After base member 1 was etched in the same manner as in Example 1, D layer 40 was formed on base member 1. Specifically, D layer 40 was formed while adjusting the vapor deposition time so as to achieve a thickness of 2.0 μm under the conditions described below.

Target: Al (30 atom %), Ti (70 atom %)
Introduced gas: $N_2$
Film forming pressure: 4 Pa
Arc discharge current: 150 A
Substrate bias voltage: −35V
Table rotation speed: 3 rpm.

(Formation of C Layer)

Then, C layer 30 was formed on D layer 40. Specifically, C layer 30 was formed while adjusting the vapor deposition time so as to achieve a thickness of 0.2 μm under the conditions described below.

Target: Al (70 atom %), Cr (30 atom %)
Introduced gas: $N_2$
Film forming pressure: 4 Pa
Arc discharge current: 150 A Substrate bias voltage: −35V
Table rotation speed: 3 rpm.
(Formation of B Layer)
After forming C layer 30, a B layer 20 having a multilayer structure formed of a B1 layer and a B2 layer and having a thickness of 0.1 μm was formed in the same manner as with the B layer in Example 1.
(Formation of A Layer)
Subsequent to formation of B layer 20, an A layer 10 was formed thereon. Specifically, an A layer 10 having a thickness of 0.5 μm was formed under the conditions described below. In this case, the flow rate of the introduced gas ($N_2$ and $CH_4$) was adjusted so as to be set at C:N=1:1 in A layer 10.
Target: Ti
Introduced gas: $N_2$, $CH_4$
Film forming pressure: 2 Pa
Arc discharge current: 180 A
Substrate bias voltage: −350V
Table rotation speed: 3 rpm.
A coated cBN tool (Sample No. 7) including coating film 100 having A layer 10 and C layer 30 was obtained on the cBN sintered body as described above. In Sample No. 7, A layer 10 is formed on outermost surface S1 of coating film 100, and distance d between outermost surface S1 and upper surface S2 of C layer 30 is 0.6 μm. The configuration of Sample No. 7 is shown in Table 4.

(Manufacture of Samples Nos. 8 to 10 and 17)
Coated cBN tools according to Samples Nos. 8 to 10 and 17 were obtained in the same manner as with Sample No. 7 except that the composition and the flow rate of the target materials and the introduced gas were changed so as to form A layer 10 having a composition shown in Table 4.
(Manufacture of Sample No. 11)
In Sample No. 11, after D layer 40, C layer 30 and B layer 20 were formed on base member 1 in the same manner as described above, A layer 10 was formed, that includes a region in which ya in equation $Ti_{1-xa}Ma_{xa}C_{1-ya}N_{ya}$ changes in a slope-like manner or in a step-like manner in the thickness direction of the coating film. In Table 4, the composition of this A layer 10 is indicated as "TiCN*$^{01}$" for convenience. The A layer was formed specifically in the following manner.
(Formation of A Layer: TiCN*$^{01}$)
First, 0.05 μm of a TiN layer was formed using only $N_2$ as introduced gas (namely, fixed at ya=1.0). Then, 0.2 μm of a TiCN layer having ya (an N composition) decreasing in a slope-like manner (1-ya (C composition) increasing in a slope-like manner) was formed while gradually increasing the flow rate of $CH_4$ in introduced gas. The composition of the TiCN layer was ultimately $TiC_{0.5}N_{0.5}$ (that is, ya=0.5). Then, 0.05 μm of a $TiC_{0.5}N_{0.5}$ layer was formed in the state where the flow rate ratio between $N_2$ and $CH_4$ was fixed. In this way, A layer 10 (TiCN*$^{01}$) was formed on B layer 20.

TABLE 4

| | | | Coating Film | | | | | |
|---|---|---|---|---|---|---|---|---|
| | cBN | | Thickness of Entire Coating | A Layer | | B Layer | | |
| | | | | | | Number | | B1 Layer |
| Sample No. | Sintered Body | Distanced/ μm | Film/ μm | Composition $Ti_{1-xa}Ma_{xa}C_{1-ya}N_{ya}$ | Thickness/ μm | of Layers | Thickness/ μm | Composition | Thickness/ nm |
| 7* | C | 0.60 | 2.80 | $TiC_{0.5}N_{0.5}$ | 0.50 | 10 | 0.10 | TiN | 10 |
| 8* | | 0.60 | 2.80 | $TiC_{0.1}N_{0.9}$ | 0.50 | | | | |
| 9* | | 0.60 | 2.80 | $Ti_{0.9}Cr_{0.1}N$ | 0.50 | | | | |
| 10* | | 0.60 | 2.80 | $Ti_{0.8}Cr_{0.2}C_{0.5}N_{0.5}$ | 0.50 | | | | |
| 11* | | 0.40 | 2.60 | TiCN*$^{01}$ | 0.30 | | | | |
| 12* | | 0.65 | 2.85 | TiCN*$^{02}$ | 0.55 | | | | |
| 13* | | 0.48 | 2.68 | TiCN*$^{03}$ | 0.38 | | | | |
| 14* | | 0.40 | 2.60 | TiCN*$^{04}$ | 0.30 | | | | |
| 15* | | 0.62 | 2.82 | TiCN*$^{05}$ | 0.52 | | | | |
| 16* | | 0.65 | 2.85 | $Ti_{0.9}Nb_{0.1}CN$*$^{06}$ | 0.55 | | | | |
| 17* | | 0.60 | 2.80 | $Ti_{0.9}W_{0.1}C_{0.5}N_{0.5}$ | 0.50 | | | | |

| | Coating Film | | | | | Evaluation Results | |
|---|---|---|---|---|---|---|---|
| | B Layer B2 Layer | | C Layer | | D Layer | | Flank Face Wear | Finished Surface |
| Sample No. | Composition | Thickness/ nm | Composition $Al_{1-(xc+yc)}Cr_{xc}Mc_{yc}N$ | Thickness/ μm | Composition | Thickness/ μm | Amount VB/mm | Roughness Rz/μm |
| 7* | AlCrN | 10 | $Al_{0.7}Cr_{0.3}N$ | 0.20 | $Ti_{0.3}Al_{0.7}N$ | 2.0 | 0.036 | 2.5 |
| 8* | | | | | | | 0.040 | 2.7 |
| 9* | | | | | | | 0.047 | 2.8 |
| 10* | | | | | | | 0.038 | 2.7 |
| 11* | | | | | | | 0.039 | 2.4 |
| 12* | | | | | | | 0.038 | 2.7 |
| 13* | | | | | | | 0.040 | 2.5 |
| 14* | | | | | | | 0.042 | 2.4 |
| 15* | | | | | | | 0.038 | 2.7 |
| 16* | | | | | | | 0.037 | 2.7 |
| 17* | | | | | | | 0.037 | 2.6 |

In this A layer 10, ya in $Ti_{1-xa}Ma_{xa}C_{1-ya}N_{ya}$ changes in a slope-like manner in the thickness direction of A layer 10. Thereby, a coated cBN tool according to Sample No. 11 was obtained. The configuration of this A layer is shown in Table 5. In the column of "Value of ya in $Ti_{1-xa}Ma_{xa}C_{1-ya}N_{ya}$" in Table 5, for example, "1→0.5" means that the value of ya decreases continuously from 1 to 0.5.

TABLE 5

| A Layer | Distance from Upper Surface of A Layer (μm) | Value of ya in $Ti_{1-xa}Ma_{xa}C_{1-ya}N_{ya}$ |
|---|---|---|
| TiCN*01 | 0~0.05 | 0.5 |
|  | 0.05~0.25 | 1→0.5 |
|  | 0.25~0.30 | 1 |
| TiCN*02 | 0~0.07 | 1 |
|  | 0.07~0.24 | 0.5→1 |
|  | 0.24~0.30 | 0.5 |
|  | 0.30~0.48 | 1→0.5 |
|  | 0.48~0.55 | 1 |
| TiCN*03 | 0~0.05 | 1 |
|  | 0.05~0.17 | 0.5→1 |
|  | 0.17~0.21 | 0.5 |
|  | 0.21~0.33 | 1→0.5 |
|  | 0.33~0.38 | 1 |
| TiCN*04 | 0~0.05 | 0.7 |
|  | 0.05~0.25 | 1→0.7 |
|  | 0.25~0.30 | 1 |
| TiCN*05 | 0~0.52 | 0.5→1 |
| $Ti_{0.9}Nb_{0.1}CN$*06 | 0~0.07 | 1 |
|  | 0.07~0.24 | 0.5→1 |
|  | 0.24~0.30 | 0.5 |
|  | 0.30~0.48 | 1→0.5 |
|  | 0.48~0.55 | 1 |

(Manufacture of Samples Nos. 12 to 16)

Coated cBN tools according to Samples Nos. 12 to 16 were obtained in the same manner as with Sample No. 11 except that A layers 10 having compositions and configurations of "TiCN*02" to "$Ti_{0.9}Nb_{0.1}CN$*06" shown in Table 5 were formed.

<Evaluations>

The cutting performance and the finished surface roughness of the coated cBN tool according to each of Samples Nos. 7 to 17 obtained as described above were evaluated by continuous cutting of hardened steel in the same manner as in Example 1. The results thereof are shown in Table 4. As shown in Table 4, Samples Nos. 7 to 17 are different in configuration of A layer 10 from one another.

(Results and Consideration)

When comparing Sample No. 7 and Sample No. 8, it turns out that the wear resistance and the processing precision are improved as the value of ya changes from 0.9 to 0.5. Therefore, it can be said that ya is preferably 0≤ya≤0.9 and more preferably 0≤ya≤0.5.

Based on the results of Samples Nos. 9, 10, 16, and 17, it turns out that Mc in the A layer ($Ti_{1-xa}Ma_{xa}C_{1-ya}N_{ya}$) can be Cr, Nb and W. Furthermore, based on the results of Samples Nos. 11 to 16, it can be recognized as preferable that the A layer includes a region where ya changes in a slope-like manner or in a step-like manner in the thickness direction of the A layer.

Example 3: Review of Composition of C Layer (Manufacture of Samples Nos. 18 to 22)

A base member 1 was obtained in the same manner as in Example 1 except that a cBN sintered body D was used in place of cBN sintered body A. Then, coated cBN tools according to Samples Nos. 18 to 22 were obtained in the same manner as in Example 2 except that D layer 40, C layer 30, B layer 20, and A layer 10 each having a composition and a configuration shown in Table 6 were laminated in this order to form coating film 100.

TABLE 6

| | | | Coating Film | | | | | |
|---|---|---|---|---|---|---|---|---|
| | | | Thickness of Entire | | | B Layer | | |
| | cBN | | Coating | A Layer | | Number | | B1 Layer |
| Sample No. | Sintered Body | Distanced/ μm | Film/ μm | Composition $Ti_{1-xa}Ma_{xa}C_{1-ya}N_{ya}$ | Thickness/ μm | of Layers | Thickness/ μm | Composition | Thickness/ nm |
| 18* | D | 0.40 | 2.1 | TiCN*01 | 0.30 | 10 | 0.10 | TiN | 10 |
| 19 |  | 0.40 |  |  |  |  |  |  |  |
| 20* |  | 0.40 |  |  |  |  |  |  |  |
| 21* |  | 0.40 |  |  |  |  |  |  |  |
| 22* |  | 0.40 |  |  |  |  |  |  |  |

| | | | | | | Evaluation Results | |
|---|---|---|---|---|---|---|---|
| | | | Coating Film | | | Flank | |
| | B Layer B2 Layer | | C Layer | | D Layer | | Face Wear | Finished Surface |
| Sample No. | Composition | Thickness/ nm | Composition $Al_{1-(xc+yc)}Cr_{xc}Mc_{yc}N$ | Thickness/ μm | Composition | Thickness/ μm | Amount VB/mm | Roughness Rz/μm |
| 18* | AlCrN | 10 | $Al_{0.7}Cr_{0.3}N$ | 0.2 | $Ti_{0.5}Al_{0.45}Nb_{0.05}N$ | 1.5 | 0.038 | 2.3 |
| 19 |  |  | $Al_{0.5}Ti_{0.5}N$ | 0.035 |  | 3.5 |  |  |
| 20* |  |  | $Al_{0.3}Cr_{0.4}Ti_{0.3}N$ | 0.036 |  | 2.4 |  |  |
| 21* |  |  | $Al_{0.5}Cr_{0.3}Si_{0.2}N$ | 0.040 |  | 2.4 |  |  |
| 22* |  |  | $Al_{0.75}Cr_{0.2}V_{0.05}N$ | 0.040 |  | 2.4 |  |  |

<Evaluations>

The cutting performance and the finished surface roughness of the coated cBN tool according to each of Samples Nos. 18 to 22 obtained as described above were evaluated by continuous cutting of hardened steel in the same manner as in Example 1. The results thereof are shown in Table 6. As shown in Table 6, Samples Nos. 18 to 22 were different in composition of C layer 30 from one another.

(Results and Consideration)

When comparing No. 18 to No. 22, the result showed that only sample No. 19 was poor in processing precision despite that all Samples have the same configuration except for the composition of C layer 30. It is considered this is because the C layer in Sample No. 19 did not contain Cr (that is, Xc was less than 0.2), so that the C layer could not sufficiently suppress development of boundary wear.

Example 4: Review of Thickness of C Layer (Manufacture of Sample No. 23)
(Formation of Base Member)

A base member 1 was obtained in the same manner as in Example 1 except that a cBN sintered body E was used in place of cBN sintered body A.

(Formation of Coating Film)

Referring to FIG. 2, coating film 200 including two laminated units each having an A layer disposed on a C layer was formed on base member 1 as described below.

An $Al_{0.8}Cr_{0.2}N$ layer having a thickness of 0.05 μm was formed as first C layer 31 on base member 1, on which an $Al_{0.5}Ti_{0.3}Cr_{0.2}N$ layer having a thickness of 0.1 μm was then formed as first B layer 21, on which a $TiCN*^{01}$ layer having a thickness of 0.3 μm was further formed as first A layer 11. This $TiCN*^{01}$ layer includes a region in which ya in equation $Ti_{1-xa}Ma_{xa}C_{1-ya}N_{ya}$ changes in a slope-like manner or in a step-like manner in the thickness direction of the coating film. Thereby, a first laminated unit 51 was formed.

After the above-described $Al_{0.5}Ti_{0.3}Cr_{0.2}N$ layer having a thickness of 0.1 μm was then formed on first laminated unit 51, a second laminated unit 52 having the same configuration as that of first laminated unit 51 was formed thereon. In other words, a coating film including two laminated units each having an A layer disposed on a C layer was formed. Thus, a coated cBN tool according to Sample No. 23 was obtained as described above. The configuration of Sample No. 23 is shown in Table 7. In addition, the description of the B layer ($Al_{0.5}Ti_{0.3}Cr_{0.2}N$ layer) formed between the first laminated unit and the second laminated unit is not shown in Table 7. Similarly, the description of the B layer formed between the laminated units is also not shown in the table. In Table 7, the "Number of Laminated Units" shows the number of laminated units each having an A layer disposed on a C layer (the same applies hereinafter).

TABLE 7

| | | | | Coating Film | | | | | | |
|---|---|---|---|---|---|---|---|---|---|---|
| | | | Thickness | First Laminated Unit, Second Laminated Unit | | | | | | |
| | | Dis- | of Entire | Number | A Layer | | B Layer | | C Layer | |
| Sample No. | cBN Sintered Body | tance d/ μm | Coating Film/ μm | of Laminated Units | Composition $Ti_{1-xa}Ma_{xa}C_{1-ya}N_{ya}$ | Thickness/ μm | Number of Layers | Thickness/ μm | Composition | Composition $Al_{1-(xc+yc)}Cr_{xc}Mc_{yc}N$ | Thickness/ μm |
| 23* | E | 0.40 | 1.00 | 2 | $TiCN*^{01}$ | 0.30 | 1 | 0.10 | $Al_{0.5}Ti_{0.3}Cr_{0.2}N$ | $Al_{0.8}Cr_{0.2}N$ | 0.05 |
| 24* | | 0.40 | 1.12 | | | | | | | | 0.11 |
| 25* | | 0.40 | 1.30 | | | | | | | | 0.20 |
| 26* | | 0.40 | 2.70 | | | | | | | | 0.90 |
| 27* | | 0.40 | 3.30 | | | | | | | | 1.20 |

| | Evaluation Results | |
|---|---|---|
| Sample No. | Flank Face Wear Amount VB/mm | Finished Surface Roughness Rz/μm |
| 23* | 0.038 | 3.4 |
| 24* | 0.039 | 2.8 |
| 25* | 0.040 | 2.4 |
| 26* | 0.042 | 2.6 |
| 27* | 0.048 | 2.8 |

(Manufacture of Samples Nos. 24 to 27)

Then, coated cBN tools according to Samples Nos. 24 to 27 were obtained in the same manner as with Sample No. 23 except that the thickness of the C layer was changed in each of first laminated unit 51 and second laminated unit 52 as shown in Table 7.

<Evaluations>

The cutting performance and the finished surface roughness of the coated cBN tool according to each of Samples Nos. 23 to 27 obtained as described above were evaluated by continuous cutting of hardened steel in the same manner as in Example 1. The results thereof are shown in Table 7.

(Results and Consideration)

Sample No. 23 showed the results that the processing precision was relatively poor as compared with Samples Nos. 24 to 26 having the same coating film configuration except for the thickness of the C layer. It is considered this is because the C layer of Sample No. 23 was slightly thinner, so that development of the boundary wear was greater as compared with other Samples. Furthermore, Sample No. 27 showed the result that the wear amount was slightly larger than those of other Samples. It is considered this is because the C layer of Sample No. 27 was slightly thicker, so that development of flank face wear was accelerated. Therefore, it can be said based on the above-described results that the C layer preferably has a thickness of 0.1 μm or more and 1.0 μm or less, and more preferably has a thickness of 0.11 μm or more and 0.9 μm or less.

Example 5: Review of Configuration of B Layer (Manufacture of Samples Nos. 29 to 33)

A base member 1 was obtained in the same manner as in Example 1 except that a cBN sintered body H was used in place of cBN sintered body A. Then, coated cBN tools according to Samples Nos. 29 to 33 were obtained in the same manner as in Example 2, except that D layer 40, C layer 30, B layer 20, and A layer 10 each having a composition and a configuration shown in Table 8 were laminated in this order to form coating film 100. As shown in Table 8, B layers 20 of Samples Nos. 29 to 33 are different in thickness of the B layer, in thickness of each of the B1 layer and the B2 layer, and in number of layers of each of the B1 layer and the B2 layer.

the results that peeling did not occur but the flank face wear amount was relatively large. It is considered this is because B layer 20 was relatively thin, leading to deterioration of the adhesiveness between A layer 10 and C layer 30, thereby accelerating development of wear. Sample No. 33 also showed the result that the flank face wear amount was relatively large. It is considered this is because B layer 20 was relatively thick.

Based on the above-described results, it is preferable that the coating film includes a B layer between the A layer and the C layer, and also preferable that the B layer includes a multilayer structure formed by alternately laminating one or more B1 layers each formed of TiN and one or more B2 layers each formed of AlCrN, and the B1 layer and the B2 layer each have a thickness of 0.5 nm or more and less than 30 nm.

TABLE 8

| | | | Coating Film | | | | | | |
|---|---|---|---|---|---|---|---|---|---|
| | cBN | | Thickness of Entire Coating | A Layer | | | B Layer | | |
| | | | | | | | Number | | B1 Layer |
| Sample No. | Sintered Body | Distance d/ μm | Film/ μm | Composition $Ti_{1-xa}Ma_{xa}C_{1-ya}N_{ya}$ | Thickness/ μm | | of Layers | Thickness/ μm | Composition | Thickness/ nm |
| 28* | H | 0.50 | 2.70 | $TiC_{0.5}N_{0.5}$ | 0.50 | 0 | None | — | — |
| 29* | | 0.505 | 2.705 | | | 10 | 0.005 | TiN | 0.5 |
| 30* | | 0.51 | 2.71 | | | 10 | 0.01 | | 1 |
| 31* | | 0.70 | 2.90 | | | 40 | 0.20 | | 5 |
| 32* | | 0.70 | 3.10 | | | 10 | 0.20 | | 20 |
| 33 | | 0.90 | 3.34 | | | 10 | 0.40 | | 40 |

| | Coating Film | | | | | Evaluation Results | |
|---|---|---|---|---|---|---|---|
| | B Layer B2 Layer | | C Layer | | D Layer | | Flank Face Wear | Finished Surface |
| Sample No. | Composition | Thickness/ nm | Composition $Al_{1-(xc+yc)}Cr_{xc}Mc_{yc}N$ | Thickness/ μm | Composition | Thickness/ μm | Amount VB/mm | Roughness Rz/μm |
| 28* | — | — | $Al_{0.7}Cr_{0.3}N$ | 0.20 | $Ti_{0.5}Al_{0.5}N$ | 2.0 | 0.050 (Peeled) | 2.6 |
| 29* | AlCrN | 0.5 | | | | | 0.059 | 2.6 |
| 30* | | 1 | | | | | 0.040 | 2.6 |
| 31* | | 5 | | | | | 0.040 | 2.5 |
| 32* | | 20 | | | | | 0.050 | 2.5 |
| 33 | | 40 | | | | | 0.067 | 2.6 |

(Manufacture of Sample No. 28)

A coated cBN tool according to Sample No. 28 was obtained in the same manner as in Samples Nos. 29 to 33 except that B layer 20 was not formed but A layer 10 was directly formed on C layer 30.

<Evaluations>

The cutting performance and the finished surface roughness of the coated cBN tool according to each of Samples No. 28 to No. 33 obtained as described above were evaluated by continuous cutting of hardened steel in the same manner as in Example 1. The results thereof are shown in Table 8.

In Sample No. 28, the adhesiveness between A layer 10 and C layer 30 was relatively low, so that peeling occurred between A layer 10 and C layer 30. Sample No. 29 showed Example 6: Review of Laminated Unit (1)

(Manufacture of Sample No. 34)

A base member 1 was obtained in the same manner as in Example 1 except that a cBN sintered body H was used in place of cBN sintered body A. Then, first C layer 31, first B layer 21, and first A layer 11 each having a composition and a configuration shown in Table 9 were laminated in this order on base member 1, thereby forming coating film 200, so that a coated cBN tool according to Sample No. 34 was obtained. Sample No. 34 includes one laminated unit having an A layer disposed on a C layer.

TABLE 9

| | | Coating Film First Laminated Unit | | | | | | | | | |
|---|---|---|---|---|---|---|---|---|---|---|---|
| | | | | | | B Layer | | | | C Layer | |
| | cBN | A Layer | | Number | | B1 Layer | | B2 Layer | | | Thick- |
| Sample No. | Sintered Body | Composition $Ti_{1-xa}Ma_{xa}C_{1-ya}N_{ya}$ | Thickness/ μm | of Layers | Thickness/ μm | Composition | Thickness/ nm | Composition | Thickness/ nm | Composition $Al_{1-(xc+yc)}Cr_{xc}Mc_{yc}N$ | ness/ μm |
| 34* | H | $TiC_{0.2}N_{0.8}$ | 0.50 | 10 | 0.10 | TiN | 10 | AlCrN | 10 | $Al_{0.7}Cr_{0.3}N$ | 0.20 |
| 35* | | $TiC_{0.2}N_{0.8}$ | 1.80 | | | None | | | | None | — |
| 36* | | $TiC_{0.2}N_{0.8}$ | 0.50 | 10 | 0.10 | TiN | 10 | AlCrN | 10 | $Al_{0.7}Cr_{0.3}N$ | 0.20 |

(Manufacture of Sample No. 35)

After first A layer 11 was formed in the same manner as with Sample No. 34, a $B_0$ layer (having a thickness of 0.1 μm) was formed as an adhesion layer on first A layer 11, on which second laminated unit 52 shown in Table 10 was further formed, thereby obtaining a coated cBN tool according to Sample No. 35. Sample No. 35 includes one laminated unit having an A layer disposed on a C layer.

TABLE 10

| | Coating Film Second Laminated Unit | | | | | | | | | |
|---|---|---|---|---|---|---|---|---|---|---|
| | | | | | B Layer | | | | | |
| | A Layer | | Number | | B1 Layer | | B2 Layer | | C Layer | |
| Sample No. | Composition $Ti_{1-xa}Ma_{xa}C_{1-ya}N_{ya}$ | Thickness/ μm | of Layers | Thickness/ μm | Composition | Thickness/ nm | Composition | Thickness/ nm | Composition $Al_{1-(xc+yc)}Cr_{xc}Mc_{yc}N$ | Thickness/ μm |
| 34* | | | | | None | | | | | |
| 35* | $TiC_{0.2}N_{0.8}$ | 0.50 | 10 | 0.10 | TiN | 10 | AlCrN | 10 | $Al_{0.7}Cr_{0.3}N$ | 0.20 |
| 36* | | | | | | | | | | |

(Manufacture of Sample No. 36)

As shown in Tables 9 to 11, first laminated unit 51, second laminated unit 52 and third laminated unit 53 were formed in this order on base member 1, thereby obtaining a coated cBN tool according to Sample No. 36. In addition, a $B_0$ layer (having a thickness of 0.1 μm) was formed between the laminated units, to thereby cause the A layer and the C layer to closely adhere to each other.

TABLE 11

| | | Coating Film | | | | | | | |
|---|---|---|---|---|---|---|---|---|---|
| | | Thickness of Entire | | Third Laminated Unit | | | | | |
| | | | | | | | B Layer | | |
| | | Coating | Number of | A Layer | | Number | | B1 Layer | |
| Sample No. | Distance d/ μm | Film/ μm | Laminated Units | Composition $Ti_{1-xa}Ma_{xa}C_{1-ya}N_{ya}$ | Thickness/ μm | of Layers | Thickness/ μm | Composition | Thickness/ nm |
| 34* | 0.60 | 0.8 | 1 | None (First laminated unit forms outermost surface) | | | | | |
| 35* | 0.60 | 2.7 | 1 | None (Second laminated unit forms outermost surface) | | | | | |
| 36* | 0.60 | 2.6 | 3 | $TiC_{0.2}N_{0.8}$ | 0.50 | 10 | 0.10 | TiN | 10 |

| | Coating Film Third Laminated Unit | | | | Evaluation Results | | |
|---|---|---|---|---|---|---|---|
| | B Layer B2 Layer | | C Layer | | Flank Face Wear | Finished Surface | Surface Roughness |
| Sample No. | Composition | Thickness/ nm | Composition $Al_{1-(xc+yc)}Cr_{xc}Mc_{yc}N$ | Thickness/ μm | Amount VB/mm | Roughness Rz/μm | Life/ km |
| 34* | None (First laminated unit forms outermost surface) | | | | 0.041 | 2.6 | 4 |
| 35* | None (Second laminated unit forms outermost surface) | | | | 0.041 | 2.6 | 7 |
| 36* | AlCrN | 10 | $Al_{0.7}Cr_{0.3}N$ | 0.20 | 0.041 | 2.6 | 10 |

<Evaluations>

The cutting performance and the finished surface roughness of the coated cBN tool according to each of Samples Nos. 34 to 36 obtained as described above were evaluated by continuous cutting of hardened steel in the same manner as in Example 1. The results thereof are shown in Table 11.

Furthermore, the surface roughness life of each Sample was evaluated in Example 6 as described below.

(Measurement of Surface Roughness Life)

Then, the surface roughness life in high precision processing was measured based on the life determination criterion defined as Rz=3.2 μm. Specifically, one set of processing at a cutting distance of 500 m was repeatedly performed under the above-described cutting conditions; surface roughness Rzjis of the work material was measured using a surface roughness meter each time one set of processing ended; and then, the test was ended at the point of time when Rzjis exceeded 3.2 rpm. Then, the total cutting distance (km) was calculated based on 500 m×the number of sets of processing. Furthermore, a scatter diagram was prepared in which the vertical axis shows Rzjis while the horizontal axis shows a cutting distance, to obtain the cutting distance at which Rz reached 3.2 μm on the straight line connecting two points of the end point and the point immediately before the end point in the scatter diagram. This obtained cutting distance was defined as a surface roughness life. The results thereof are shown in Table 11.

(Results and Consideration)

As shown in Tables 9 to 11, Samples Nos. 34 to 36 have the same configuration in a region from the outermost surface of the coating film to the C layer located closest to the outermost surface-side of the coating film. Accordingly, Samples Nos. 34 to 36 were almost equivalent in wear resistance and processing precision at the point of time when cutting was done by 3 km.

It was confirmed in the evaluation of the surface roughness life that the surface roughness life tended to increase in accordance with the number of laminated units included in each Sample. Particularly when comparing No. 35 and No. 36, the results showed that No. 36 was longer in surface roughness life than No. 35 even though the coating film of No. 36 was thinner. Therefore, from the viewpoint of the surface roughness life, the coating film includes a plurality of A layers and a plurality of C layers, and preferably includes two or more laminated units each having an A layer disposed on a C layer, and more preferably includes three or more laminated units.

Example 7: Review of Laminated Unit (2)

(Manufacture of Samples Nos. 37 to 40)

A base member 1 was obtained in the same manner as in Example 1 except that cBN sintered body C was used in place of cBN sintered body A. Then, laminated units shown in Tables 12 to 15 were laminated in this order on base member 1, thereby obtaining coated cBN tools according to Samples Nos. 37 to 40. In addition, a $B_0$ layer (having a thickness of 0.1 μm) was formed as an adhesion layer between the laminated units. Also in Table 15, the number of laminated units of Sample No. 37 was defined as one. This means that Sample No. 37 does not have a C layer in the first laminated unit (Table 12), so that there exists one laminated unit having an A layer disposed on a C layer.

TABLE 12

| | | Coating Film First Laminated Unit | | | | | | | | |
|---|---|---|---|---|---|---|---|---|---|---|
| | | A Layer | | B Layer | | | | | C Layer | |
| | cBN | | Thick- | | | B1 Layer | | B2 Layer | | Thick- |
| Sample No. | Sintered Body | Composition $Ti_{1-xa}Ma_{xa}C_{1-ya}N_{ya}$ | ness/ μm | Number of Layers | Thickness/ μm | Composition | Thickness/ nm | Composition | Thickness/ nm | Composition $Al_{1-(xc+yc)}Cr_{xc}Mc_{yc}N$ | ness/ μm |
| 37* | C | $TiC_{0.5}N_{0.5}$ | 0.70 | | | None | | | | None | — |
| 38* | | TiCN*01 | 0.30 | 10 | 0.10 | TiN | 10 | AlCrN | 10 | $Al_{0.7}Cr_{0.3}N$ | 0.20 |
| 39* | | TiCN*03 | 0.38 | | | | | | | | |
| 40* | | | | | | | | | | | |

TABLE 13

| | Coating Film Second Laminated Unit | | | | | | | | | |
|---|---|---|---|---|---|---|---|---|---|---|
| | A Layer | | | B Layer | | | | | C Layer | |
| | | | | | | B1 Layer | | B2 Layer | | |
| Sample No. | Composition $Ti_{1-xa}Ma_{xa}C_{1-ya}N_{ya}$ | Thickness/ μm | Number of Layers | Thickness/ μm | Composition | Thickness/ nm | Composition | Thickness/ nm | Composition $Al_{1-(xc+yc)}Cr_{xc}Mc_{yc}N$ | Thickness/ μm |
| 37* | TiCN*01 | 0.30 | 10 | 0.10 | TiN | 10 | AlCrN | 10 | $Al_{0.7}Cr_{0.3}N$ | 0.20 |
| 38* | | | | | | | | | | |
| 39* | TiCN*02 | 0.61 | | | | | | | | |
| 40* | | | | | | | | | | |

TABLE 14

| | Coating Film Third Laminated Unit | | | | | | | | |
|---|---|---|---|---|---|---|---|---|---|
| | A Layer | | B Layer | | | | | C Layer | |
| | | | | B1 Layer | | B2 Layer | | | |
| Sample No. | Composition $Ti_{1-xa}Ma_{xa}C_{1-ya}N_{ya}$ | Thickness/ μm | Number of Layers | Thickness/ μm | Composition | Thickness/ nm | Composition | Thickness/ nm | Composition $Al_{1-(xc+yc)}Cr_{xc}Mc_{yc}N$ | Thickness/ μm |
| 37* | | | | | None | | | | | |
| 38* | | | | | None | | | | | |
| 39* | TiCN*[01] | 0.30 | 10 | 0.10 | TiN | 10 | AlCrN | 10 | $Al_{0.7}Cr_{0.3}N$ | 0.20 |
| 40* | TiCN*[02] | 0.61 | | | | | | | | |

TABLE 15

| | | Coating Film | | | | | | |
|---|---|---|---|---|---|---|---|---|
| | | Thickness of Entire Coating Film/ μm | Fourth Laminated Unit | | | | | |
| | | | | A Layer | | B Layer | | |
| | | | | | | | Number of Layers | B1 Layer |
| Sample No. | Distance d/ μm | | Number of Laminated Units | Composition $Ti_{1-xa}Ma_{xa}C_{1-ya}N_{ya}$ | Thickness/ μm | | Thickness/ μm | Composition | Thickness/ nm |
| 37* | 0.40 | 1.40 | 1 | None (Second laminated unit forms outermost surface) | | | | | |
| 38* | 0.40 | 1.30 | 2 | None (Second laminated unit forms outermost surface) | | | | | |
| 39* | 0.40 | 2.39 | 3 | None (Third laminated unit forms outermost surface) | | | | | |
| 40* | 0.40 | 3.40 | 4 | TiCN*[01] | 0.30 | 10 | 0.1 | TiN | 10 |

| | Coating Film Fourth Laminated Unit | | | | Evaluation Results | | |
|---|---|---|---|---|---|---|---|
| | B Layer B2 Layer | | C Layer | | Flank Face Wear | Finished Surface | Surface Roughness |
| Sample No. | Composition | Thickness/ nm | Composition $Al_{1-(xc+yc)}Cr_{xc}Mc_{yc}N$ | Thickness/ μm | Amount VB/mm | Roughness Rz/μm | Life/ km |
| 37* | None (Second laminated unit forms outermost surface) | | | | 0.039 | 2.3 | 8 |
| 38* | None (Second laminated unit forms outermost surface) | | | | 0.038 | 2.3 | 13 |
| 39* | None (Third laminated unit forms outermost surface) | | | | 0.038 | 2.3 | 15 |
| 40* | AlCrN | 10 | $Al_{0.7}Cr_{0.3}N$ | 0.20 | 0.038 | 2.3 | 17.5 |

<Evaluations>

The cutting performance, the finished surface roughness and the surface roughness life of the coated cBN tool according to each of Samples Nos. 37 to 40 obtained as described above were evaluated by continuous cutting of hardened steel in the same manner as in Example 6. The results thereof are shown in Table 15.

(Results and Consideration)

As shown in Tables 12 to 15, Samples Nos. 37 to 40 have the same configuration in a region from the outermost surface of the coating film to the C layer closest to the outermost surface-side. Accordingly, Samples Nos. 37 to 40 were almost equivalent in wear resistance and processing precision at the point of time when cutting was done by 3 km. Furthermore, it was confirmed that the surface roughness life tends to increase as the number of laminated units increases like Example 6.

Based on the results of No. 37 to No. 40, the following could be confirmed. Specifically, even in the case where the same laminated units are not repeatedly used but the laminated units including A layers of different thicknesses and compositions are used, excellent processing precision and an excellent surface roughness life can be implemented as long as the A layer included in each laminated unit is formed of $Ti_{1-xa}Ma_{xa}C_{1-ya}N_{ya}$ (where Ma is one or more of Cr, Nb and W; xa is 0≤xa≤0.7; and ya is 0≤ya≤1), the C layer is formed of $Al_{1-(xc+yc)}Cr_{xc}Mc_{yc}N$ (where Mc is one or more of Ti, V and Si; xc is 0.2≤xc≤0.8; yc is 0≤yc≤0.6; and xc+yc is 0.2≤xc+yc≤0.8).

Example 8: Review of cBN Sintered Body (Manufacture of Samples Nos. 41 to 46)

Then, a base member 1 was obtained in the same manner as in Example 1 except that cBN sintered bodies B to G were used in place of cBN sintered body A as shown in Tables 16 to 18. Then, a coating film 200 obtained by laminating laminated units shown in Tables 16 to 18 in this order was formed on this base member 1, thereby obtaining coated cBN tools according to Samples Nos. 41 to 46. In addition, a $B_0$ layer (having a thickness of 0.1 μm) was formed as an adhesion layer between the laminated units.

TABLE 16

| | | Coating Film First Laminated Unit | | | | | | | | | |
|---|---|---|---|---|---|---|---|---|---|---|---|
| | | A Layer | | | B Layer | | | | | C Layer | |
| | | | | Number | | B1 Layer | | B2 Layer | | | |
| Sample No. | cBN Sintered Body | Composition $Ti_{1-xa}Ma_{xa}C_{1-ya}N_{ya}$ | Thickness/ μm | of Layers | Thickness/ μm | Composition | Thickness/ nm | Composition | Thickness/ nm | Composition $Al_{1-(xc+yc)}Cr_{xc}Mc_{yc}N$ | Thickness/ μm |
| 41* | B | TiCN*03 | 0.38 | 10 | 0.10 | TiN | 10 | AlCrN | 10 | $Al_{0.7}Cr_{0.3}N$ | 0.20 |
| 42* | C | | | | | | | | | | |
| 43* | D | | | | | | | | | | |
| 44* | E | | | | | | | | | | |
| 45* | F | | | | | | | | | | |
| 46* | G | | | | | | | | | | |

TABLE 17

| | | Coating Film Second Laminated Unit | | | | | | | | | |
|---|---|---|---|---|---|---|---|---|---|---|---|
| | A Layer | | | | B Layer | | | | | C Layer | |
| | | | | | | B1 Layer | | B2 Layer | | | |
| Sample No. | Composition $Ti_{1-xa}Ma_{xa}C_{1-ya}N_{ya}$ | Thickness/ μm | Number of Layers | Thickness/ μm | Composition | Thickness/ nm | Composition | Thickness/ nm | | Composition $Al_{1-(xc+yc)}Cr_{xc}Mc_{yc}N$ | Thickness/ μm |
| 41* | TiCN*02 | 0.61 | 10 | 0.10 | TiN | 10 | AlCrN | 10 | | $Al_{0.7}Cr_{0.3}N$ | 0.20 |
| 42* | | | | | | | | | | | |
| 43* | | | | | | | | | | | |
| 44* | | | | | | | | | | | |
| 45* | | | | | | | | | | | |
| 46* | | | | | | | | | | | |

TABLE 18

| | | | Coating Film | | | | | | |
|---|---|---|---|---|---|---|---|---|---|
| | | Thickness of Entire | | Third Laminated Unit | | | | | |
| | | | | | A Layer | | | B Layer | |
| | | | | | | | Number | B1 Layer | |
| Sample No. | cBN Sintered Body | Distance d/ μm | Coating Film/ μm | Number of Laminated Units | Composition $Ti_{1-xa}Ma_{xa}C_{1-ya}N_{ya}$ | Thickness/ μm | of Layers | Thickness/ μm | Composition | Thickness/ nm |
| 41* | B | 0.40 | 2.39 | 3 | TiCN*03 | 0.30 | 10 | 0.10 | TiN | 10 |
| 42* | C | | | | | | | | | |
| 43* | D | | | | | | | | | |
| 44* | E | | | | | | | | | |
| 45* | F | | | | | | | | | |
| 46* | G | | | | | | | | | |

| | Coating Film Third Laminated Unit | | | | Evaluation Results | | |
|---|---|---|---|---|---|---|---|
| | B Layer B2 Layer | | C Layer | | Flank Face Wear | Finished Surface | Surface Roughness |
| Sample No. | Composition | Thickness/ nm | Composition $Al_{1-(xc+yc)}Cr_{xc}Mc_{yc}N$ | Thickness/ μm | Amount VB/mm | Roughness Rz/μm | Life/ km |
| 41* | AlCrN | 10 | $Al_{0.7}Cr_{0.3}N$ | 0.20 | 0.038 | 2.3 | 15 |
| 42* | | | | | 0.038 | 2.3 | 16 |
| 43* | | | | | 0.038 | 2.3 | 16.5 |
| 44* | | | | | 0.038 | 2.3 | 15 |
| 45* | | | | | 0.038 | 2.3 | 16 |
| 46* | | | | | 0.038 | 2.3 | 17 |

<Evaluations>

The cutting performance, the finished surface roughness and the surface roughness life of the coated cBN tool according to each of Samples Nos. 41 to 46 obtained as described above were evaluated by continuous cutting of hardened steel in the same manner as in Example 6. The results thereof are shown in Table 18.

(Results and Consideration)

As shown in Tables 16 to 18, Samples Nos. 41 to 46 were identical in configuration of coating film 200. Accordingly, these Samples Nos. 41 to 46 were almost equivalent in wear resistance and processing precision at the point of time when cutting was done by 3 km. On the other hand, the surface roughness lives were different as a result. Specifically, the result showed that Samples each made using a sintered body containing cBN particles of 50 vol % or more and 60 vol % or less in volume content were longer in surface roughness life than other Samples. It can be considered that this result was influenced by the wear resistance and the fracture resistance of the cBN sintered body forming the base member.

Example 9: Review of B Layer in Laminated Unit

Then, a coated cBN tool according to Sample No. 47 was obtained in the same manner as with the above-described Sample No. 36 except that a B layer was not formed between the A layer and the C layer in each laminated unit and a $B_0$ layer was not formed between the laminated units, as shown in Tables 19 to 21.

TABLE 19

| | | Coating Film First Laminated Unit | | | | | | | | | |
|---|---|---|---|---|---|---|---|---|---|---|---|
| | | A Layer | | | | B Layer | | | | C Layer | |
| | | | | | | B1 Layer | | B2 Layer | | | |
| Sample No. | cBN Sintered Body | Composition $Ti_{1-xa}Ma_{xa}C_{1-ya}N_{ya}$ | Thickness/ μm | Number of Layers | Thickness/ μm | Composition | Thickness/ nm | Composition | Thickness/ nm | Composition $Al_{1-(xc+yc)}Cr_{xc}Mc_{yc}N$ | Thickness/ μm |
| 36* | H | $TiC_{0.2}N_{0.8}$ | 0.50 | 10 | 0.10 | TiN | 10 | AlCrN | 10 | $Al_{0.7}Cr_{0.3}N$ | 0.20 |
| 47* | | | | | | None | | | | | |

TABLE 20

| | | Coating Film Second Laminated Unit | | | | | | | | |
|---|---|---|---|---|---|---|---|---|---|---|
| | A Layer | | | B Layer | | | | | C Layer | |
| | | | | B1 Layer | | B2 Layer | | | | |
| Sample No. | Composition $Ti_{1-xa}Ma_{xa}C_{1-ya}N_{ya}$ | Thickness/ μm | Number of Layers | Thickness/ μm | Composition | Thickness/ nm | Composition | Thickness/ nm | Composition $Al_{1-(xc+yc)}Cr_{xc}Mc_{yc}N$ | Thickness/ μm |
| 36* | $TiC_{0.2}N_{0.8}$ | 0.50 | 10 | 0.10 | TiN | 10 | AlCrN | 10 | $Al_{0.7}Cr_{0.3}N$ | 0.20 |
| 47* | | | | | None | | | | | |

TABLE 21

| | | | | Coating Film | | | | | |
|---|---|---|---|---|---|---|---|---|---|
| | | Thickness of Entire Coating Film/ μm | | Third Laminated Unit | | | | | |
| | | | | | A Layer | | | B Layer | |
| | | | | | | | | | B1 Layer |
| Sample No. | Distance d/ μm | | Number of Laminated Units | Composition $Ti_{1-xa}Ma_{xa}C_{1-ya}N_{ya}$ | Thickness/ μm | Number of Layers | Thickness/ μm | Composition | Thickness/ nm |
| 36* | 0.60 | 2.6 | 3 | $TiC_{0.2}N_{0.8}$ | 0.50 | 10 | 0.10 | TiN | 10 |
| 47* | 0.50 | 2.1 | | | | | | None | |

| | Coating Film Third Laminated Unit | | | | Evaluation Results | | |
|---|---|---|---|---|---|---|---|
| | B Layer B2 Layer | | C Layer | | Flank Face Wear | Finished Surface | Surface Roughness |
| Sample No. | Composition | Thickness/ nm | Composition $Al_{1-(xc+yc)}Cr_{xc}Mc_{yc}N$ | Thickness/ μm | Amount VB/mm | Roughness Rz/μm | Life/ km |
| 36* | AlCrN | 10 | $Al_{0.7}Cr_{0.3}N$ | 0.20 | 0.041 | 2.6 | 10 |
| 47* | None | | | | 0.040 | 2.5 | 8 (Peeled) |

<Evaluations>

The cutting performance, the finished surface roughness and the surface roughness life of the coated cBN tool according to Sample No. 47 obtained as described above were evaluated by continuous cutting of hardened steel in the same manner as in Example 6. The results thereof are shown in Table 21.

(Results and Consideration)

As shown in Tables 19 to 21, peeling occurred during measurement of the surface roughness life in Sample No. 47. This result shows that it is preferable that a B layer is disposed between the A layer and the C layer in each laminated unit.

Based on the results described above, it could be confirmed that excellent processing precision and wear resistance were provided in the coated cBN tool according to Example, which includes a cBN sintered body and a coating film formed thereon, in which the coating film includes an A layer and a C layer, the A layer is formed of $Ti_{1-xa}Ma_{xa}C_{1-ya}N_{ya}$ (where Ma is one or more of Cr, Nb and W; xa is $0 \leq xa \leq 0.7$; and ya is $0 \leq ya \leq 1$), the C layer is formed of $Al_{1-(xc+yc)}Cr_{xc}Mc_{yc}N$ (where Mc is one or more of Ti, V and Si; xc is $0.2 \leq xc \leq 0.8$; yc is $0 \leq yc \leq 0.6$; and xc+yc is $0.2 \leq xc+yc \leq 0.8$), the A layer is formed on the outermost surface of the coating film or between the outermost surface of the coating film and the C layer, and a distance between the outermost surface of the coating film and the upper surface of the C layer is 0.1 µm or more and 1.0 µm or less.

Although the present embodiments and examples have been described as above, the configurations of the embodiments and examples described above are intended to be combined as appropriate from the beginning.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1 base member, 10 A layer, 11 first A layer, 12 second A layer, 13 third A layer, 14 fourth A layer, 20 B layer, 21 first B layer, 22 second B layer, 23 third B layer, 24 fourth B layer, 30 C layer, 31 first C layer, 32 second C layer, 33 third C layer, 34 fourth C layer, 40 D layer, 51 first laminated unit, 52 second laminated unit, 53 third laminated unit, 54 fourth laminated unit, 100, 200 coating film, 101, 201 coated cBN tool, S1 outermost surface, S2 upper surface, d distance.

The invention claimed is:

1. A surface-coated boron nitride sintered body tool comprising: a cubic boron nitride sintered body; and a coating film formed thereon,
   the coating film including an A layer and a C layer,
   the A layer being formed of $Ti_{1-xa}Ma_{xa}C_{1-ya}N_{ya}$ (where Ma is one or more of Cr, Nb and W; xa is $0 \leq xa \leq 0.7$; and ya is $0 \leq ya \leq 1$),
   the C layer being formed of $Al_{1-(xc+yc)}Cr_{xc}Mc_{yc}N$ (where Mc is one or more of Ti, V and Si; xc is $0.2 \leq xc \leq 0.8$; yc is $0 \leq yc \leq 0.6$; and xc+yc is $0.2 \leq xc+yc \leq 0.8$),
   the A layer being formed on an outermost surface of the coating film or between the outermost surface of the coating film and the C layer,
   a distance between the outermost surface of the coating film and an upper surface of the C layer being 0.1 µm or more and 1.0 µm or less, and
   a thickness of the A layer is 0.1 µm or more and 0.7 µm or less.

2. The surface-coated boron nitride sintered body tool according to claim 1, wherein the distance between the outermost surface of the coating film and the upper surface of the C layer is 0.3 µm or more and 0.7 µm or less.

3. The surface-coated boron nitride sintered body tool according to claim 1, wherein the C layer has a thickness of 0.1 µm or more and 1.0 µm or less.

4. The surface-coated boron nitride sintered body tool according to claim 1, wherein the coating film includes a plurality of the A layers and a plurality of the C layers, and includes two or more laminated units each having the A layer disposed on the C layer.

5. The surface-coated boron nitride sintered body tool according to claim 1, wherein
   the coating film further includes a B layer between the A layer and the C layer, and
   the B layer contains one or more compounds formed of:
   one or more elements selected from the group consisting of Al, Cr and Ti; and N.

6. The surface-coated boron nitride sintered body tool according to claim 5, wherein the B layer includes a multilayer structure formed by alternately laminating one or more B1 layers each formed of TiN and one or more B2 layers each formed of AlCrN.

7. The surface-coated boron nitride sintered body tool according to claim 6, wherein the B1 layers and the B2 layers each have a thickness of 0.5 nm or more and less than 30 nm.

8. The surface-coated boron nitride sintered body tool according to claim 5, wherein the B layer contains a compound formed of AlTiCrN.

9. The surface-coated boron nitride sintered body tool according to claim 1, wherein the A layer includes a region in which the ya changes in a slope-like manner or in a step-like manner in a thickness direction of the A layer.

10. The surface-coated boron nitride sintered body tool according to claim 1, wherein the C layer is in contact with the cubic boron nitride sintered body.

11. The surface-coated boron nitride sintered body tool according to claim 1, wherein the coating film has a thickness of 0.5 µm or more and 10 µm or less.

* * * * *